United States Patent
Kim et al.

(10) Patent No.: US 9,245,957 B2
(45) Date of Patent: Jan. 26, 2016

(54) SEMICONDUCTOR MATERIALS, TRANSISTORS INCLUDING THE SAME, AND ELECTRONIC DEVICES INCLUDING TRANSISTORS

(71) Applicant: Samsung Electronics Co., Ltd., Suwon-Si, Gyeonggi-Do (KR)

(72) Inventors: Tae-sang Kim, Seoul (KR); Sun-jae Kim, Seoul (KR); Hyun-suk Kim, Hwaseong-si (KR); Myung-kwan Ryu, Yongin-si (KR); Joon-seok Park, Yongin-si (KR); Seok-jun Seo, Anyang-si (KR); Jong-baek Seon, Yongin-si (KR); Kyoung-seok Son, Seoul (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/093,121

(22) Filed: Nov. 29, 2013

(65) Prior Publication Data

US 2014/0151690 A1 Jun. 5, 2014

(30) Foreign Application Priority Data

Nov. 30, 2012 (KR) .................. 10-2012-0138508
Aug. 16, 2013 (KR) .................. 10-2013-0097345

(51) Int. Cl.
*H01L 29/10* (2006.01)
*H01L 29/24* (2006.01)
*H01L 29/786* (2006.01)

(52) U.S. Cl.
CPC ............ *H01L 29/24* (2013.01); *H01L 29/7869* (2013.01); *H01L 29/78693* (2013.01); *H01L 29/78696* (2013.01)

(58) Field of Classification Search
CPC ... H01L 29/24; H01L 29/786; H01L 29/7869; H01L 21/02521; H01L 21/0262; H01L 21/02631; H01L 21/02644; H01L 29/66742

USPC ............. 257/43, E29.068, E27.112, E21.409, 257/E21.002, E29.273, E21.412; 252/347, 252/512–513, 519.1; 349/43; 423/386; 438/592, 795, 104, 85

See application file for complete search history.

(56) References Cited

U.S. PATENT DOCUMENTS

| 4,990,286 A | 2/1991 | Gordon |
| 6,299,294 B1 | 10/2001 | Regan |

(Continued)

FOREIGN PATENT DOCUMENTS

| JP | 2858444 B2 | 2/1999 |
| KR | 2007-0053617 A | 5/2007 |

(Continued)

OTHER PUBLICATIONS

European Search Report dated Feb. 21, 2014 for corresponding European application No. 13 193 348.3.

(Continued)

*Primary Examiner* — Lynne Gurley
*Assistant Examiner* — Tong-Ho Kim
(74) *Attorney, Agent, or Firm* — Harness, Dickey & Pierce, P.L.C.

(57) ABSTRACT

According to example embodiments, a semiconductor material may include zinc, nitrogen, and fluorine. The semiconductor material may further include oxygen. The semiconductor material may include a compound. For example, the semiconductor material may include zinc fluorooxynitride. The semiconductor material may include zinc oxynitride containing fluorine. The semiconductor material may include zinc fluoronitride. The semiconductor material may be applied as a channel material of a thin film transistor (TFT).

20 Claims, 25 Drawing Sheets

(56) References Cited

U.S. PATENT DOCUMENTS

| | | | |
|---|---|---|---|
| 6,362,084 | B1 | 3/2002 | Nakamura et al. |
| 6,624,441 | B2 | 9/2003 | Cantwell et al. |
| 7,771,688 | B2 | 8/2010 | Lee et al. |
| 7,927,713 | B2 | 4/2011 | Ye |
| 7,994,508 | B2 | 8/2011 | Ye |
| 8,197,914 | B2 | 6/2012 | Garg et al. |
| 8,294,148 | B2 | 10/2012 | Ye |
| 2006/0108636 | A1 | 5/2006 | Sano et al. |
| 2009/0179199 | A1* | 7/2009 | Sano et al. ............... 257/43 |
| 2010/0095866 | A1 | 4/2010 | Schreiber et al. |
| 2010/0129722 | A1 | 5/2010 | Martin et al. |
| 2011/0128275 | A1 | 6/2011 | Ueda et al. |
| 2011/0266538 | A1* | 11/2011 | Lee et al. ............... 257/43 |
| 2011/0278567 | A1 | 11/2011 | Ye |
| 2012/0001168 | A1 | 1/2012 | Ichijo et al. |
| 2012/0037911 | A1 | 2/2012 | Kim et al. |
| 2012/0152728 | A1 | 6/2012 | Yamazaki |
| 2012/0168757 | A1* | 7/2012 | Park et al. ............... 257/59 |
| 2012/0231243 | A1 | 9/2012 | Watanabe et al. |
| 2013/0020569 | A1 | 1/2013 | Yamazaki et al. |
| 2013/0277672 | A1 | 10/2013 | Sano et al. |
| 2013/0292675 | A1* | 11/2013 | Tsubuku et al. ............... 257/57 |
| 2014/0001462 | A1 | 1/2014 | Shieh et al. |
| 2014/0152936 | A1 | 6/2014 | Kim et al. |

FOREIGN PATENT DOCUMENTS

| | | | |
|---|---|---|---|
| KR | 2008-0112091 | A | 12/2008 |
| KR | 20090127906 | A | 12/2009 |
| KR | 20110089143 | A | 8/2011 |
| KR | 20120089795 | A | 8/2012 |

OTHER PUBLICATIONS

Lin et al., Development on a transparent conductive ZnO thin films doped with various impurity elements, Rare Metals, vol. 30, No. (Apr. 2011), p. 175.

Lv et al., Preparation N-F-codoped TiO2 nanorod array by liquid phase deposition as visible light photocatalyst, Materials Research Bulletin 46 (2011) 361-365.

T. Yamamoto, Codoping for the fabrication of p-type ZnO, Thin Solid Films 420-421 (2002) 100-106.

Jie Sun, PECVD, Spatial ALD, and Peald Zinc Oxide Thin Film Transistors, 2008.

Choi et al, Luminescence and electrical properties of solution-processed ZnO thin films by adding fluorides and annealing atmosphere, Materials Research Bulletin 46 (2011) 810-814.

Janotti et al., Fundamental of zinc oxide as a semiconductor, Reports on Progress in Physics, 72 (2009) 126501.

Douaya et al., Fluorine-doped ZnO thin films deposited by spray pyrolysis technique, Eur. Phys. J. Appl. Phys. 53, 20501 (2011).

Wen et al., First-principles investigate of electronic structure and optical properties in N-F codoped ZnO with wurtzite structure, Eur. Phys. J. B. 80, 25-30 (2011).

Yan Ye et al, "High mobility amorphous zinc oxynitride semiconductor material for thin film transistors", J. Appl. Phys. 106, 074512 (2009); published online Oct. 13, 2009.

Rana Saha et al, "Remarkable Properties of ZnO Heavily Substituted with Nitrogen and Fluorine, Zn01-x (N, F)x", ChemPhysChem 14, 2672 (2013); published online on Jun. 28, 2013.

Office Action for corresponding U.S. Appl. No. 14/093,153 dated Nov. 3, 2014.

Office Action issued in Co-Pending U.S. Appl. No. 14/093,153 on Jun. 8, 2015.

* cited by examiner

SEMICONDUCTOR MATERIALS, TRANSISTORS INCLUDING THE SAME, AND ELECTRONIC DEVICES INCLUDING TRANSISTORS

CROSS-REFERENCE TO RELATED APPLICATIONS

This application claims priority under 35 U.S.C. §119 to Korean Patent Application Nos. 10-2012-0138508 and 10-2013-0097345, respectively filed on Nov. 30, 2012 and Aug. 16, 2013, in the Korean Intellectual Property Office, the disclosures of which are incorporated herein in their entirety by reference.

BACKGROUND

1. Field

Example embodiments relate to semiconductor materials and/or devices including the same, and more particularly, to semiconductor materials, transistors including the same, and/or electronic devices including the transistors.

2. Description of Related Art

Transistors are widely used as switching devices and/or driving devices in electronic devices. In particular, since a thin film transistor (TFT) may be manufactured on a glass substrate or a plastic substrate, TFTs may be used in display apparatuses such as organic light-emitting display apparatuses or liquid crystal display apparatuses. The performance of a TFT may depend on properties of a channel layer (e.g., semiconductor layer).

Many commercially available display apparatuses use a TFT including a channel layer formed of amorphous silicon (hereinafter, referred to as an amorphous silicon TFT) or a TFT including a channel layer formed of polycrystalline silicon (hereinafter, referred to as a polycrystalline silicon TFT). An amorphous silicon TFT may have a charge mobility of about 0.5 $cm^2/Vs$ or so, which is so low and may limit an operating speed of a display apparatus including an amorphous silicon TFT. A polycrystalline silicon TFT may be formed by a manufacturing process that includes crystallization, impurity doping, and activation processes. As a result, manufacturing processes and costs for a polycrystalline silicone TFT may be higher than those for an amorphous silicon TFT. Also, it may be difficult to ensure uniformity of a polycrystalline silicon layer in the polycrystalline silicon TFT; consequently, image quality may be reduced when the polycrystalline silicon layer is used as a channel layer of a large-size display apparatus.

In order to realize a next generation high-performance and/or high-resolution large-size display apparatus, a TFT having excellent performance is desirable. In this regard, research has been conducted on an oxide TFT using an oxide semiconductor having a high carrier mobility as a material of a channel layer. However, a conventional oxide TFT may not ensure excellent switching characteristics (e.g., ON/OFF characteristics) and high reliability. Accordingly, there is a demand for a transistor (TFT) having excellent switching characteristics and high reliability as well as having a high mobility.

SUMMARY

Example embodiments relate to semiconductor materials (e.g., semiconductor thin films).

Example embodiments relate to transistors using the semiconductor materials as channel materials.

Example embodiments relate to transistors having a high mobility and excellent switching characteristics.

Example embodiments relate to transistors having a low subthreshold swing value.

Example embodiments relate to transistors having a low OFF current level.

Example embodiments relate to electronic devices (e.g., display apparatuses) including transistors according to example embodiments.

Additional aspects will be set forth in part in the description that follows and, in part, will be apparent from the description, or may be learned by practice of example embodiments.

According to example embodiments, a compound semiconductor includes: zinc (Zn), nitrogen (N), and fluorine (F).

In example embodiments, the compound semiconductor may further include oxygen (O). The compound semiconductor may include zinc oxynitride (ZnON) containing fluorine (F).

In example embodiments, a composition ratio of fluorine (F) with respect to materials except for zinc (Zn) in the compound semiconductor is 3 at % or more.

In example embodiments, the compound semiconductor may include zinc fluoronitride (ZnFN).

In example embodiments, the compound semiconductor may include an amorphous phase.

In example embodiment, the compound semiconductor may include a nanocrystalline phase.

In example embodiments, the compound semiconductor may further include at least one of a Group I element, a Group II element, a Group III element, a Group IV element, a Group V element, and a Lanthanide (Ln) element. The Lanthanide element may be selected from the group consisting of La, Ce, Pr, Nd, Pm, Sm, Eu, Gd, Tb, Dy, Ho, Er, Tm, Yb, and Lu.

According to example embodiments, a thin film transistor (TFT) may include: a gate electrode; a channel corresponding (e.g., adjacent to) to the gate electrode; a gate insulating layer between the gate electrode and the channel; and a source and a drain respectively contacting two portions of the channel. The compound semiconductor may include zinc (Zn), nitrogen (N), and fluorine (F). The gate insulating layer may contact the gate electrode and the channel.

In example embodiments, the compound semiconductor of the TFT may further include oxygen (O). The compound semiconductor may include zinc oxynitride (ZnON) containing fluorine (F).

In example embodiments, a composition ratio of fluorine (F) with respect to materials except for zinc (Zn) in the compound semiconductor of the TFT is about 3 at % or more.

In example embodiments, the compound semiconductor of the TFT may include zinc fluoronitride (ZnFN).

In example embodiments, the compound semiconductor may include an amorphous phase.

In example embodiment, the compound semiconductor may include a nanocrystalline phase.

In example embodiments, the gate electrode may be on a substrate, the gate insulating layer may be on the gate electrode, and the channel may be on a region of the gate insulating layer corresponding to the gate electrode. In this case, the transistor may have a bottom-gate structure.

In example embodiments, the source and drain electrodes may be on the substrate, the channel may be on the substrate between the source and drain electrodes, the gate insulating layer is on the channel, and the gate electrode may be on a region of the gate insulating layer corresponding to the channel. In this case, the transistor may have a top-gate structure.

According to example embodiments, a semiconductor material includes: zinc (Zn), fluorine (F), oxygen (O), and nitrogen (N).

In example embodiments, the semiconductor material may include zinc fluorooxynitride.

In example embodiments, the semiconductor material may include zinc oxynitride containing fluorine.

In example embodiments, the semiconductor material may include a compound semiconductor.

In example embodiments, the semiconductor material may be a quaternary compound.

In example embodiments, a content ratio of fluorine to a sum of nitrogen, oxygen, and fluorine [(100×F/(N+O+F)] in the semiconductor material may be equal to or greater than about 3 at %.

In example embodiments, a content ratio of fluorine to a sum of nitrogen, oxygen, and fluorine [(100×F/(N+O+F)] in the semiconductor material may be equal to or greater than about 5 at %.

In example embodiments, a content ratio of fluorine to the sum of nitrogen, oxygen, and fluorine [(100×F/(N+O+F)] in the semiconductor material may range from about 5 at % to about 35 at %.

In example embodiments, a content ratio of nitrogen to a sum of nitrogen, oxygen, and fluorine [(100×N/(N+0+F)] in the semiconductor material may be equal to or greater than about 50 at %.

In example embodiments, a content ratio of nitrogen to a sum of nitrogen, oxygen, and fluorine [(100×N/(N+0+F)] in the semiconductor material may be equal to or greater than about 60 at %.

In example embodiments, the content ratio of nitrogen to the sum of nitrogen, oxygen, and fluorine [(100×N/(N+0+F)] in the semiconductor material may range from about 60 at % to about 90 at %.

In example embodiments, a content ratio of oxygen to a sum of nitrogen, oxygen, and fluorine [(100×O/(N+O+F)] in the semiconductor material may be equal to or smaller than about 40 at %.

In example embodiments, a content ratio of oxygen to a sum of nitrogen, oxygen, and fluorine [(100×O/(N+O+F)] in the semiconductor material may be equal to or smaller than about 30 at %.

In example embodiments, the content ratio of oxygen to the sum of nitrogen, oxygen, and fluorine [(100×O/(N+O+F)] in the semiconductor material may range from about 5 at % to about 30 at %.

In example embodiments, a Hall mobility of the semiconductor material may be equal to or greater than about 10 cm$^2$/Vs.

In example embodiments, the semiconductor material may have a Hall mobility of equal to or greater than about 20 cm$^2$/Vs.

In example embodiments, the semiconductor material may include an amorphous phase.

In example embodiments, the semiconductor material may include a nanocrystalline phase.

In example embodiments, the semiconductor material may further include at least one of a Group I element, a Group II element, a Group III element, a Group IV element, a Group V element, a transition metal element, and a Lanthanide (Ln) element.

In example embodiments, the semiconductor material may further include at least one of lithium (Li), potassium (K), magnesium (Mg), calcium (Ca), strontium (Sr), barium (Ba), gallium (Ga), aluminum (Al), indium (In), boron (B), silicon (Si), tin (Sn), germanium (Ge), antimony (Sb), yttrium (Y), titanium (Ti), zirconium (Zr), vanadium (V), niobium (Nb), tantalum (Ta), scandium (Sc), hafnium (Hf), molybdenum (Mo), manganese (Mn), iron (Fe), cobalt (Co), nickel (Ni), copper (Cu), tungsten (W), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

In example embodiments, the semiconductor material may include a compound composed of zinc (Zn), fluorine (F), oxygen (O), and nitrogen (N).

According to example embodiments, a semiconductor material includes zinc (Zn), nitrogen (N), and fluorine (F).

In example embodiments, the semiconductor material may include zinc fluoronitride (ZnFN).

In example embodiments, the semiconductor material may include a compound semiconductor.

In example embodiments, a content ratio of fluorine to a sum of nitrogen and fluorine [(100×F/(N+F)] in the semiconductor material may be equal to or greater than about 3 at %.

In example embodiments, a content ratio of fluorine to a sum of nitrogen and fluorine [(100×F/(N+F)] in the semiconductor material may be equal to or greater than about 5 at %.

In example embodiments, a content ratio of fluorine to the sum of nitrogen and fluorine [(100×F/(N+F)] in the semiconductor material may range from about 5 at % to about 45 at %.

In example embodiments, a content ratio of nitrogen to a sum of nitrogen and fluorine [(100×N/(N+F)] in the semiconductor material may be equal to or greater than about 55 at %.

In example embodiments, a content ratio of nitrogen to a sum of nitrogen and fluorine [(100×N/(N+F)] in the semiconductor material may be equal to or greater than about 65 at %.

In example embodiments, the content ratio of nitrogen to the sum of nitrogen and fluorine [(100×N/(N+F)] in the semiconductor material may range from about 65 at % to about 95 at %.

In example embodiments, a Hall mobility of the semiconductor material may be equal to or greater than about 10 cm$^2$/Vs.

In example embodiments, the semiconductor material may have a Hall mobility equal to or greater than about 20 cm$^2$/Vs.

In example embodiments, the semiconductor material may include an amorphous phase.

In example embodiments, the semiconductor material may include a nanocrystalline phase.

In example embodiments, the semiconductor material may further include at least one of a Group I element, a Group II element, a Group III element, a Group IV element, a Group V element, a transition metal element, and a lanthanide (Ln) element.

In example embodiments, the semiconductor material may further include at least one of lithium (Li), potassium (K), magnesium (Mg), calcium (Ca), strontium (Sr), barium (Ba), gallium (Ga), aluminum (Al), indium (In), boron (B), silicon (Si), tin (Sn), germanium (Ge), antimony (Sb), yttrium (Y), titanium (Ti), zirconium (Zr), vanadium (V), niobium (Nb), tantalum (Ta), scandium (Sc), hafnium (Hf), molybdenum (Mo), manganese (Mn), iron (Fe), cobalt (Co), nickel (Ni), copper (Cu), tungsten (W), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

In example embodiments, the semiconductor material may include a compound composed of zinc (Zn), fluorine (F), and nitrogen (N).

According to example embodiments, a thin film transistor (TFT) includes: a channel element; a gate electrode corresponding (e.g., adjacent) to the channel element; a gate insulating layer that is between the channel element and the gate electrode; and a source and a drain that respectively contact first and second regions of the channel element. The semiconductor material may include zinc (Zn), fluorine (F), oxygen (O), and nitrogen (N). The gate insulating layer may contact the gate electrode and the channel.

In example embodiments, the semiconductor material of the channel element may include zinc fluorooxynitride.

In example embodiments, the semiconductor material of the channel element may include zinc oxynitride containing fluorine.

In example embodiments, the semiconductor material of the channel element may include a compound semiconductor.

In example embodiments, the semiconductor material of the channel element may be a quaternary compound.

In example embodiments, a content ratio of fluorine to a sum of nitrogen, oxygen, and fluorine in the semiconductor material of the channel element may be equal to or greater than about 3 at %.

In example embodiments, a content ratio of fluorine to a sum of nitrogen, oxygen, and fluorine $[(100 \times F/(N+O+F)]$ in the semiconductor material of the channel element may be equal to or greater than about 5 at %.

In example embodiments, a content ratio of fluorine to the sum of nitrogen, oxygen, and fluorine $[(100 \times F/(N+O+F)]$ in the semiconductor material of the channel element may range from about 5 at % to about 35 at %.

In example embodiments, a content ratio of nitrogen to a sum of nitrogen, oxygen, and fluorine $[(100 \times N/(N+O+F)]$ in the semiconductor material of the channel element may be equal to or greater than about 50 at %.

In example embodiments, a content ratio of nitrogen to a sum of nitrogen, oxygen, and fluorine $[(100 \times N/(N+O+F)]$ in the semiconductor material of the channel element may be equal to or greater than about 60 at %.

In example embodiments, a content ratio of nitrogen to the sum of nitrogen, oxygen, and fluorine $[(100 \times N/(N+O+F)]$ in the semiconductor material of the channel element may range from about 60 at % to about 90 at %.

In example embodiments, a content ratio of oxygen to a sum of nitrogen, oxygen, and fluorine in the semiconductor material of the channel element may be equal to or smaller than about 40 at %.

In example embodiments, a content ratio of oxygen to a sum of nitrogen, oxygen, and fluorine $[(100 \times O/(N+O+F)]$ in the semiconductor material of the channel element may be equal to or smaller than about 30 at %.

In example embodiments, a content ratio of oxygen to the sum of nitrogen, oxygen, and fluorine $[(100 \times O/(N+O+F)]$ in the semiconductor material of the channel element may range from about 5 at % to about 30 at %.

In example embodiments, a Hall mobility of the semiconductor material of the channel element may have be equal to or greater than about 10 $cm^2/Vs$.

In example embodiments, the Hall mobility of the semiconductor material of the channel element may be equal to or greater than about 20 $cm^2/Vs$.

In example embodiments, a field-effect mobility of the TFT may be equal to or greater than about 10 $cm^2/Vs$.

In example embodiments, a field-effect mobility of the TFT may be equal to or greater than about 20 $cm^2/Vs$.

In example embodiments, a subthreshold swing (S.S.) value of the TFT may be equal to or lower than about 0.95 V/dec.

In example embodiments, a subthreshold swing (S.S.) value of the TFT may be equal to or lower than about 0.75 V/dec.

In example embodiments, the channel element may be on the gate electrode.

In example embodiments, when the gate electrode is under the channel element, the TFT may further include an etch-stop layer on the channel element.

In example embodiments, the gate electrode may be on the channel element.

In example embodiments, the channel element may correspond to a first region of an active layer, the source and the drain may be on the active layer on both sides of the channel element, and the gate insulating layer and the gate electrode may be sequentially stacked on the first region of the active layer. The TFT may have a self-aligned top gate structure.

In example embodiments, the gate insulating layer may include a first layer and a second layer, the first layer may be between the gate electrode and the second layer, and the second layer may be between the first layer and the channel element. The first layer may include silicon nitride, and the second layer may include silicon oxide.

In example embodiments, a passivation layer may cover the TFT. The passivation layer may include a silicon oxide layer and a silicon nitride layer that are sequentially stacked.

In example embodiments, at least one of the gate electrode, the source electrode, and the drain electrode may have a tri-layer electrode structure.

In example embodiments, the tri-layer electrode structure may include a first layer, a second layer, and a third layer that are sequentially stacked. At least one of the first layer and the third layer may include one of titanium (Ti), molybdenum (Mo), and a combination thereof. The second layer may include one of aluminum (Al), aluminum-neodymium (AlNd), copper (Cu), and a combination thereof.

According to example embodiments, an electronic device may include the thin film transistor (TFT).

In example embodiments, the electronic device may be a display apparatus.

In example embodiments, the display apparatus may be an organic light-emitting display apparatus or a liquid crystal display apparatus.

In example embodiments, the TFT may be used as a switching device or a driving device.

According to example embodiments, a thin film transistor (TFT) includes: a channel element; a gate electrode that is disposed to correspond to the channel element; a gate insulating layer that is disposed between the channel element and the gate electrode; and a source and a drain that respectively contact first and second regions of the channel element. The semiconductor material may include zinc (Zn), nitrogen (N), and fluorine (F). The gate insulating layer may contact the gate electrode and the channel element.

In example embodiments, the semiconductor material of the channel element may include zinc fluoronitride.

In example embodiments, the semiconductor material of the channel element may include a compound semiconductor.

In example embodiments, a content ratio of fluorine to a sum of nitrogen and fluorine $[(100 \times F/(N+F)]$ in the semiconductor material of the channel element may be equal to or greater than about 3 at %.

In example embodiments, a content ratio of fluorine to a sum of nitrogen and fluorine $[(100 \times F/(N+F)]$ in the semiconductor material of the channel element may be equal to or greater than about 5 at %.

In example embodiments, content ratio of fluorine to the sum of nitrogen and fluorine [(100×F/(N+F)] in the semiconductor material of the channel element may range from about 5 at % to about 45 at %.

In example embodiments, a content ratio of nitrogen to a sum of nitrogen and fluorine [(100×F/(N+F)] in the semiconductor material of the channel element may be equal to or greater than about 55 at %.

In example embodiments, a content ratio of nitrogen to a sum of nitrogen and fluorine [(100×N/(N+F)] in the semiconductor material of the channel element may be equal to or greater than about 65 at %.

In example embodiments, a content ratio of nitrogen to the sum of nitrogen and fluorine [(100×N/(N+F)] in the semiconductor material of the channel element may range from about 65 at % to about 95 at %.

In example embodiments, a Hall mobility of the semiconductor material of the channel element may be equal to or greater than about 10 $cm^2/Vs$.

In example embodiments, a Hall mobility of the semiconductor material of the channel element may be equal to or greater than about 20 $cm^2/Vs$.

In example embodiments, a field-effect mobility of the TFT may have be equal to or greater than about 10 $cm^2/Vs$.

In example embodiments, a field-effect mobility of the TFT may be equal to or greater than about 20 $cm^2/Vs$.

In example embodiments, a subthreshold swing (S.S.) value of the TFT may be equal to or lower than about 0.95 V/dec.

In example embodiments, a subthreshold swing (S.S.) value of the TFT may be equal to or lower than about 0.75 V/dec.

In example embodiments, the channel element may be on the gate electrode.

In example embodiments, when the gate electrode is below the channel element, the TFT may further include an etch-stop layer on the channel element.

In example embodiments, the gate electrode may be on the channel element.

In example embodiments, the channel element may correspond to a first region of an active layer, the source and the drain may be on both ends of the channel element, and the gate insulating layer and the gate electrode may be sequentially stacked on the first region of the active layer. In example embodiments, the TFT may have a self-aligned top gate structure.

In example embodiments, the gate insulating layer may include a first layer and a second layer, the first layer may be between the gate electrode and the second layer, the second layer may be between the first layer and the channel element, the first layer may include silicon nitride, and the second layer may include silicon oxide.

In example embodiments, the TFT may further include a passivation layer that covers the TFT. The passivation layer may include a silicon oxide layer and a silicon nitride layer that are sequentially stacked.

In example embodiments, at least one of the gate electrode, the source electrode, and the drain electrode may have a tri-layer electrode structure.

In example embodiments, the tri-layer electrode structure may include a first layer, a second layer, and a third layer that are sequentially stacked. At least one of the first layer and the third layer may include one of titanium (Ti), molybdenum (Mo), and a combination thereof, and the second layer includes one of aluminum (Al), aluminum-neodymium (AlNd), copper (Cu), and a combination thereof.

According to example embodiments, an electronic device may include the thin film transistor (TFT).

In example embodiments, the electronic device may be a display apparatus.

In example embodiments, the display apparatus may be an organic light-emitting display apparatus or a liquid crystal display apparatus.

In example embodiments, the TFT may be used as a switching device or a driving device.

According to example embodiments, a semiconductor material includes: zinc (Zn), nitrogen (N), and fluorine (F), and an amount of fluorine (F) is less than an amount of nitrogen (N) in the semiconductor material.

In example embodiments, the semiconductor material may include an amorphous phase.

In example embodiments, the semiconductor material may include a nanocrystalline phase.

In example embodiments, the semiconductor material may further include oxygen.

In example embodiments, the semiconductor may include an amorphous phase and a nanocrystalline phase.

In example embodiments, the nanocrystalline phase may include at least one of zinc nitride, zinc oxide, and zinc fluoride.

In example embodiments, a content ration of fluorine to a sum of nitrogen, oxygen, and fluorine [(100×F/(N+O+F)] in the semiconductor material may range from about 3 at % to about 35 at %.

In example embodiments, a content ratio of oxygen to a sum of nitrogen, oxygen, and fluorine [(100×O/(N+O+F)] in the semiconductor material may range from about 2 at % to about 35 at %.

According to example embodiments, a thin film transistor (TFT) includes: a gate electrode; a channel element, source and drain electrodes that respectively contact first and second regions of the channel element; and a gate insulating layer between the channel element and the gate electrode. The gate insulating layer contacts the gate electrode and the source and drain electrodes.

In example embodiments, the gate electrode may be on the gate insulating layer.

In example embodiments, the gate insulating layer may be on the gate electrode.

According to example embodiments, a method of manufacturing a semiconductor material includes: co-sputtering a Zn target and a $ZnF_2$ target onto a substrate in a process chamber; and supplying nitrogen ($N_2$) gas into the process chamber during the co-sputtering the Zn target and the $ZnF_2$ target.

In example embodiments, oxygen ($O_2$) gas may be supplied into the process chamber during the co-sputtering the Zn target and the $ZnF_2$ target, and a supply amount of the nitrogen ($N_2$) gas may be greater than a supply amount of the oxygen ($O_2$) gas into the process chamber during the supplying nitrogen ($N_2$) gas and the supplying oxygen ($O_2$) gas.

In example embodiments, argon (Ar) gas may be supplied into the process chamber during the co-sputtering the Zn target and the $ZnF_2$ target.

In example embodiments, argon (Ar) gas may be supplied into the process chamber during the co-sputtering the Zn target and the $ZnF_2$ target, a temperature of the substrate may be maintained between 25° C. and 300° C. during the co-sputtering the Zn target and the $ZnF_2$ target, and a pressure in the process chamber may be maintained between about 0.05 Pa to about 15 Pa during the co-sputtering the Zn target and the $ZnF_2$ target.

In example embodiments, a power applied to the Zn target is greater than a power applied to the $ZnF_2$ target during the co-sputtering the Zn target and the $ZnF_2$ target.

BRIEF DESCRIPTION OF THE DRAWINGS

These and/or other aspects will become apparent and more readily appreciated from the following description of non-limiting embodiments, as illustrated in the accompanying drawings in which like reference characters refer to like parts throughout the different views. The drawings are not necessarily to scale, emphasis instead being placed upon illustrating the principles of inventive concepts.

DETAILED DESCRIPTION

Figure 1:
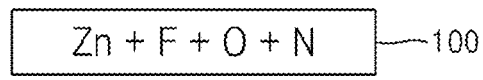
FIG. 1 is a cross-sectional view illustrating a semiconductor material (e.g., thin film) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor Material (I)

FIG. 1 is a cross-sectional view illustrating a semiconductor material 100 according to example embodiments. The semiconductor material 100 has a film (thin film) shape. The semiconductor material 100 may be a compound or may include a compound. In this regard, the semiconductor material 100 may be referred to as a "compound semiconductor" or a "semiconductor including a compound".

Referring to FIG. 1, the semiconductor material 100 may include zinc (Zn), fluorine (F), oxygen (O), and nitrogen (N). That is, the semiconductor material 100 may include a compound composed of zinc, fluorine, oxygen, and nitrogen. The compound composed of zinc, fluorine, oxygen, and nitrogen may be a quaternary compound. The quaternary compound may be zinc fluorooxynitride ($ZnF_xO_yN_z$). Accordingly, the semiconductor material 100 may include zinc fluorooxynitride. In other words, the semiconductor material 100 may include zinc oxynitride containing fluorine. The zinc oxynitride containing fluorine may be the zinc fluorooxynitride. In other words, the semiconductor material 100 may be a zinc compound semiconductor, and the zinc compound semiconductor may include fluorine, oxygen, and nitrogen. The semiconductor material 100 may be an inorganic compound semiconductor.

In the semiconductor material 100, a content ratio of fluorine to the sum of nitrogen, oxygen, and fluorine, that is, $[F/(N+O+F)]\times100$, may be equal to or greater than, for example, about 3 at % or about 5 at %. The content ratio of fluorine may range from about 3 at % to about 35 at % or from about 5 at % to about 35 at %. Alternatively, the content ratio of fluorine may range from about 3 at % to about 25 at % or from about 5 at % to about 25 at %. In the semiconductor material 100, a content ratio of nitrogen to the sum of nitrogen, oxygen, and fluorine, that is, $[N/(N+O+F)]\times100$, may be equal to or greater than, for example, about 50 at % or about 60 at %. The content ratio of nitrogen may range from about 55 at % to about 95 at % or from about 70 at % to about 95 at %. Alternatively, the content ratio of nitrogen may range from about 60 at % to about 90 at %. In the semiconductor material 100, a content ratio of oxygen to the sum of nitrogen, oxygen, and fluorine, that is, $[O/(N+O+F)]\times100$, may be equal to or less than, for example, about 40 at %. The content ratio of oxygen may range from about 2 at % to about 35 at % or from about 5 at % to about 30 at %.

The semiconductor material 100 may have a Hall mobility equal to or greater than about 10 $cm^2/Vs$, or about 20 $cm^2/Vs$, or about 30 $cm^2/Vs$. According to a condition for forming the semiconductor material 100, the Hall mobility of the semiconductor material 100 may be increased to 100 $cm^2/Vs$ or more. For example, the Hall mobility of the semiconductor material 100 may range from about 10 $cm^2/Vs$ to about 120 $cm^2/Vs$. A carrier density of the semiconductor material 100 may range, for example, from about $10^{11}/cm^3$ to about $10^{18}/cm^3$, or from about $10^{12}/cm^3$ to about $10^{17}/cm^3$. Since a conductivity type of the semiconductor material 100 may be an n-type, the term "carrier density" may refer to a concentration of electrons, and may be represented with a negative (−) sign. For convenience, herein, the carrier density (electron concentration) is expressed in a positive (+) value (without a negative sign). Meanwhile, a resistivity ρ of the semiconductor material 100 may range, for example, from about 0.01 Ωcm to about $10^6$ Ωcm, or from about 0.01 Ωcm to about $10^5$ Ωcm. Properties of the semiconductor material 100 may vary according to the forming condition and a composition ratio.

The semiconductor material 100 may include an amorphous phase. The semiconductor material 100 may partially or entirely have an amorphous phase. Also, the semiconductor material 100 may include a nanocrystalline phase. The semiconductor material 100 may have both an amorphous phase and a nanocrystalline phase. For example, the semiconductor material 100 may have a plurality of nanocrystals (nanocrystalline phase) in an amorphous matrix. The amorphous matrix may include zinc fluorooxynitride. The nanocrystals (nanocrystalline phase) may include, for example, zinc nitride. A size (diameter) of the nanocrystals (nanocrystalline phase) may range, for example, from about several nm to tens of nm. For example, a size (diameter) of the nanocrystals may range from about 1 to about 900 nm, from about 3 to 900 nm, and/or from about 5 to 850 nm.

The semiconductor material 100 may basically include zinc fluorooxynitride, and may further include at least one of zinc nitride, zinc oxide, and zinc fluoride. The zinc fluorooxynitride may be amorphous, and the zinc nitride, the zinc oxide, and the zinc fluoride may be crystalline. Also, the semiconductor material 100 may further include at least one of zinc oxynitride, zinc fluoronitride, and zinc fluorooxide. The zinc oxynitride, the zinc fluoronitride, and the zinc fluorooxide may be amorphous.

Additionally, the semiconductor material 100 may further include one or more other elements in addition to zinc, fluorine, oxygen, and nitrogen. For example, the semiconductor material 100 may further include at least one of a group I element, a Group II element, a Group III element, a Group IV element, a Group V element, a transition metal element, and a Lanthanide (Ln) element. For example, the semiconductor material 100 may further include at least one of a Group I element such as lithium (Li) or potassium (K), a group II element such as magnesium (Mg), calcium (Ca), strontium (Sr), or barium (Ba), a Group III element such as gallium (Ga), aluminum (Al), indium (In), or boron (B), a Group IV element such as silicon (Si), tin (Sn), or germanium (Ge), a Group V element such as antimony (Sb), a transition metal element such as yttrium (Y), titanium (Ti), zirconium (Zr), vanadium (V), niobium (Nb), tantalum (Ta), scandium (Sc), hafnium (Hf), molybdenum (Mo), manganese (Mn), iron (Fe), cobalt (Co), nickel (Ni), copper (Cu), or tungsten (W), and a Lanthanide element such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). Such an additional element may be doped in the semiconductor material 100. Alternatively, the additional element may constitute a compound along with basic elements of the semiconductor material 100.

Since a conductivity type of the semiconductor material 100 may be an n-type, the content ratio of the one or more elements (in addition to Zn, F, O, and N) may be controlled so as to not alter the semiconductor material 100 from being an n-type conductivity. In other words, according to example embodiments, even if the semiconductor material 100 includes one more elements (in addition to Zn, F, O, and N), a content ratio of the one or more elements may be relatively low. For example, if Li, K, or Cu are added as a dopant to the semiconductor material 100, a content ratio of the Li, K, or Cu may be less than 3 at % with respect to entire cations including Zn in the semiconductor material 100.

Although not shown in FIG. 1, a surface oxide film or an oxygen-rich material film may be disposed on a surface of the semiconductor material 100. The surface oxide film or the oxygen-rich material film may act as a protection film for the semiconductor material 100. The surface oxide film or the oxygen-rich material film may be formed by using an annealing process. The annealing process may be a stabilization process.

The term "compound semiconductor" used herein refers to a compound having semiconductor characteristics formed by combining two or more types of elements at a desired (and/or alternatively predetermined) composition ratio, unlike a silicon or germanium semiconductor composed of a single element. A compound semiconductor may have properties different from those of each of constituent elements thereof. In the above description, zinc fluorooxynitride, zinc nitride, zinc oxide, zinc fluoride, zinc oxynitride, zinc fluoronitride, and zinc fluorooxide may each be a compound formed by combining a zinc component and a component such as oxygen, nitrogen, or fluorine at a desired (and/or alternatively predetermined) composition ratio or a material including such a compound. Each compound may have relatively uniform characteristics, and may have properties different from those of each of constituent elements thereof. The above materials may be compound semiconductor materials or semiconductor materials including compounds. Also, the semiconductor material 100 of FIG. 1 may be a "compound semiconductor" or a "semiconductor including a compound". The term "compound semiconductor" or "semiconductor including a compound" used herein is to be interpreted broadly.

A method of forming the semiconductor material 100 will now be explained.

The semiconductor material 100 may be formed by using, for example, physical vapor deposition (PVD) such as sputtering. The PVD process may be performed in a process chamber. The sputtering may be reactive sputtering. Also, the sputtering may be co-sputtering using a plurality of targets. When the semiconductor material 100 is formed by using co-sputtering, a Zn target and a $ZnF_2$ target may be used. In this case, a nitrogen ($N_2$) gas or an oxygen ($O_2$) gas may be used as a reactive gas, and additionally, an argon (Ar) gas may be further used. The nitrogen gas may be a source of nitrogen, and the oxygen gas may be a source of oxygen. The argon gas may act as a carrier gas. Also, the argon gas may improve deposition efficiency by generating plasma. A flow rate of the nitrogen gas may range from about 20 sccm to about 200 sccm, and a flow rate of the oxygen gas may range from about 1 sccm to about 15 sccm. A flow rate of the argon gas may range from about 1 sccm to about 100 sccm. A supply amount of the nitrogen gas may be greater than a supply amount of the oxygen gas. For example, a supply amount of the nitrogen gas may be 10 times or more greater, or 50 times or more greater than a supply amount of the oxygen gas. Since a reactivity of oxygen to zinc is higher than that of nitrogen to zinc, the semiconductor material 100 that is nitrogen-rich may be obtained by supplying the nitrogen gas more than the oxygen gas. Also, a supply amount of the nitrogen gas may be greater than a supply amount of the argon gas. The sputtering may be performed at a room temperature or a relatively low temperature (for example, 25 to 300° C.). In other words, when the semiconductor material 100 is formed by using the sputtering, a temperature of a substrate may be maintained at a room temperature or a relatively low temperature (for example, 25 to 300° C.). A pressure of a reaction chamber may range from about 0.05 Pa to about 15 Pa. Sputtering power for the Zn target may range from about tens to thousands of W (watt), and sputtering power for the $ZnF_2$ target may range from about several to thousands of W. A fluorine content of the semiconductor material 100 may be adjusted by adjusting the sputtering power for the $ZnF_2$ target. As the sputtering power for the $ZnF_2$ target increases, the fluorine content of the semiconductor material 100 may increase. However, the aforesaid detailed process conditions are non-limiting examples, and may vary according to a sputtering system.

When a single $ZnF_2$ target is used without the Zn target, since it is difficult to break bonding between zinc and fluorine in the single $ZnF_2$ target, it may not be easy for zinc to combine with nitrogen and oxygen. In example embodiments, since the Zn target as well as the $ZnF_2$ target is used, zinc separated from the Zn target may easily combine with nitrogen and oxygen.

The aforesaid method of forming the semiconductor material 100 is a non-limiting example, and may be changed in various ways. For example, the semiconductor material 100 may be formed by using, for example, metal organic chemical vapor deposition (MOCVD). Alternatively, the semiconductor material 100 may be formed by using chemical vapor deposition (CVD), atomic layer deposition (ALD), or evaporation.

Semiconductor Material (II)

Figure 2:
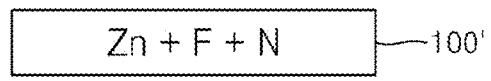
FIG. 2 is a cross-sectional view illustrating a semiconductor material (e.g., thin film) according to example embodiments.

FIG. 2 is a cross-sectional view illustrating a semiconductor material 100' according to example embodiments. The semiconductor material 100' has a film (thin film) shape. The semiconductor material 100' may be a compound or may include a compound. In this regard, the semiconductor material 100' may be referred to as a "compound semiconductor" or a "semiconductor including a compound".

Referring to FIG. 2, the semiconductor material 100' may include zinc, fluorine, and nitrogen. That is, the semiconductor material 100' may include a compound composed of zinc, fluorine, and nitrogen. In this case, the semiconductor material 100' may include zinc fluoronitride ($ZnF_xN_z$). In other words, the semiconductor material 100' may include zinc nitride containing fluorine. The zinc nitride containing fluorine may be the zinc fluoronitride. In other words, the semiconductor material 100' may be a zinc compound semiconductor, and the zinc compound semiconductor may include fluorine and nitrogen. The semiconductor material 100' of FIG. 2 may be different from the semiconductor material 100 of FIG. 1 in that the semiconductor material 100' does not include an oxygen element. However, in some cases, a small amount of oxygen may be included in the semiconductor material 100'. For example, according to an annealing (heat treatment) condition (atmosphere), a small amount of oxygen may be included in the semiconductor material 100'.

In the semiconductor material 100', a content ratio of fluorine to the sum of nitrogen and fluorine, that is, $[F/(N+F)] \times 100$, may be equal to or greater than, for example, about 3 at % or about 5 at %. The content ratio of fluorine may range from about 3 at % to about 45 at % or from about 5 at % to about 45 at %. Alternatively, the content ratio of fluorine may range from about 3 at % to about 40 at % or from about 5 at % to about 40 at %. In the semiconductor material 100', a content ratio of nitrogen to the sum of nitrogen and fluorine, that is, $[N/(N+F)] \times 100$, may be equal to or greater than, for example, about 55 at % or about 65 at %. The content ratio of nitrogen may range from about 55 at % to about 95 at % or from about 65 at % to about 95 at %. A Hall mobility and a carrier density of the semiconductor material 100' may be similar to or higher than those of the semiconductor material 100 of FIG. 1. A resistivity of the semiconductor material 100' may be similar to or lower than that of the semiconductor material 100 of FIG. 1.

The semiconductor material 100' may have an amorphous phase and/or a nanocrystalline phase. The semiconductor material 100' may entirely have an amorphous phase, or may have both an amorphous phase and a nanocrystalline phase. In the latter case, the semiconductor material 100' may have a plurality of nanocrystals (nanocrystalline phase) in an amorphous matrix. The nanocrystals (nanocrystalline phase) may be, for example, zinc nitride. The nanocrystals (nanocrystalline phase) may also be zinc fluoride. The amorphous phase may be zinc fluoronitride.

Also, the semiconductor material 100' may basically include zinc fluoronitride, and may further include at least one of zinc nitride and zinc fluoride. The zinc fluoronitride, the zinc nitride, and the zinc fluoride may each be a "compound" or a "material including a compound". In this regard, the above materials may be compound semiconductor materials or semiconductor materials including compounds, and the semiconductor material 100' of FIG. 2 may be a "compound semiconductor" or a "semiconductor including a compound". Accordingly, the terms "compound semiconductor" and "semiconductor including a compound" used herein are to be interpreted broadly. A conductivity type of the semiconductor material 100' may be an n-type.

Additionally, the semiconductor material 100' may further include one or more other elements in addition to zinc, fluorine, and nitrogen. For example, the semiconductor material 100' may further include at least one of a group I element, a group II element, a group III element, a group IV element, a group V element, a transition metal element, and a lanthanum (Ln)-based element, like the semiconductor material 100 of FIG. 1. Additional elements for the semiconductor material 100' may be the same as or similar to those for the semiconductor material 100 of FIG. 1.

Since a conductivity type of the semiconductor material 100' may be an n-type, the content ratio of the one or more elements (in addition to Zn, F, and N) may be controlled so as to not alter the semiconductor material 100' from being an n-type conductivity. In other words, according to example embodiments, even if the semiconductor material 100' includes one more elements (in addition to Zn, F, and N), a content ratio of the one or more elements may be relatively low. For example, if Li, K, or Cu are added as a dopant to the semiconductor material 100', a content ratio of the Li, K, or Cu may be less than 3 at % with respect to entire cations including Zn in the semiconductor material 100'.

A method of forming the semiconductor material 100' of FIG. 2 is similar to the method of forming the semiconductor material 100 of FIG. 1, but may be different in that the method of forming the semiconductor material 100' of FIG. 2 does not use an oxygen ($O_2$) gas. That is, the semiconductor material 100' of FIG. 2 may be obtained when a flow rate of the oxygen gas is 0 sccm in the method of forming semiconductor material 100 of FIG. 1. Although not shown in FIG. 2, a surface oxide film or an oxygen-rich material film may be disposed on a surface of the semiconductor material 100'.

Transistor (I)

Figure 3:
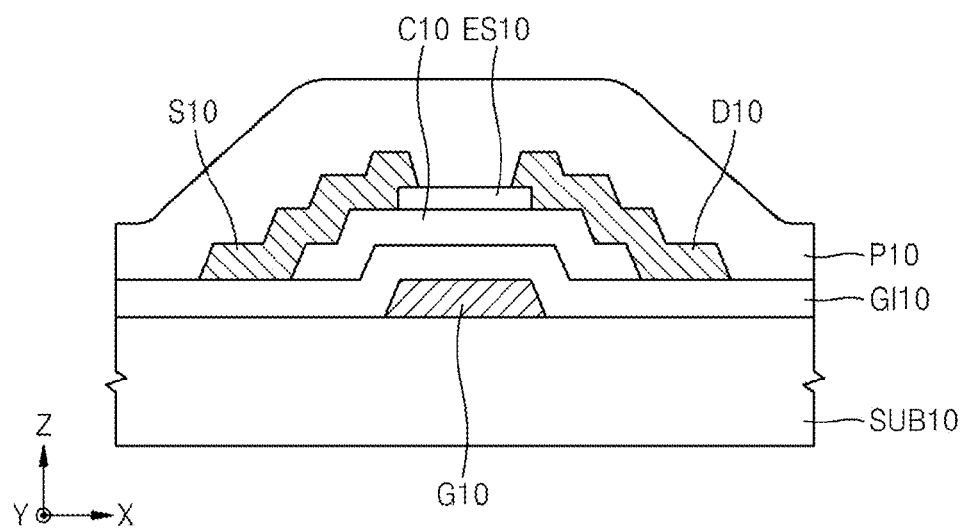
FIG. 3 is a cross-sectional view illustrating a thin film transistor (TFT) including a semiconductor material, according to example embodiments.

FIG. 3 is a cross-sectional view illustrating a thin film transistor (TFT) including a semiconductor material, according to example embodiments. The TFT of FIG. 3 is a TFT having a bottom gate structure in which a gate electrode G10 is disposed below (under) a channel layer C10.

Referring to FIG. 3, the gate electrode G10 may be disposed on a substrate SUB10. The substrate SUB10 may be a glass substrate, or any one of various substrates used in a common semiconductor device process such as a plastic substrate or a semiconductor substrate (e.g., silicon). The substrate SUB10 may be an inorganic substrate or an organic substrate, and may be transparent, opaque, or semitransparent. The gate electrode G10 may be formed of a general electrode material (e.g., a metal, an alloy, conductive metal oxide, conductive metal nitride, or the like). For example, the gate electrode G10 may be formed of a metal such as titanium (Ti), platinum (Pt), ruthenium (Ru), gold (Au), silver (Ag), molybdenum (Mo), aluminum (Al), tungsten (W), copper (Cu), neodymium (Nd), chromium (Cr), tantalum (Ta), or an alloy including the metal, or a conductive oxide such as In—Zn—O (indium zinc oxide) (IZO), Al—Zn—O (aluminum zinc oxide) (AZO), In—Sn—O (indium tin oxide) (ITO), Ga—Zn—O (gallium zinc oxide) (GZO), or Zn—Sn—O (zinc tin oxide) (ZTO), or a compound including the conductive oxide. The gate electrode G10 may have a single-layer structure or a multi-layer structure. A gate insulating layer GI10 that covers the gate electrode G10 may be disposed on the substrate SUB10. The gate insulating layer GI10 may include a silicon oxide ($SiO_2$) layer, a silicon oxynitride ($SiO_xN_y$) layer, or a silicon nitride ($Si_3N_4$) layer, or may include another material layer, for example, a high-k material (e.g., $HfO_2$ or $Al_2O_3$) layer having a dielectric constant higher than that of a silicon nitride layer. The gate insulating layer GI10 may have a structure in which at least two layers from among a silicon oxide layer, a silicon oxynitride layer, a silicon nitride layer, and a high-k material layer are stacked. In detail, the gate insulating layer GI10 may have a structure in which a silicon nitride layer and a silicon oxide layer are stacked, for example. In this case, the silicon nitride layer and the silicon oxide layer may be sequentially disposed on the gate electrode G10. Although not shown in FIG. 3, a desired (and/or alternatively predetermined) underlayer may be disposed on the substrate USB10, and the gate electrode G10 and the gate insulating layer GI10 covering the gate electrode G10 may be disposed on the underlayer. The underlayer may be an insulating layer such as an oxide layer. The oxide layer may be, for example, a silicon oxide layer. However, a material of the underlayer may be changed in various ways.

The channel layer C10 may be disposed on the gate insulating layer GI10. The channel layer C10 may be disposed over the gate electrode G10 to face the gate electrode G10. A width of the channel layer C10 in an X-axis direction may be greater than a width of the gate electrode G10 in the X-axis direction. However, in some cases, a width of the channel layer C10 may be similar to or less than a width of the gate electrode G10. A material of the channel layer C10 may be the same as the semiconductor material 100 of FIG. 1 or may be the same as the semiconductor material 100' of FIG. 2. That is, the channel layer C10 may be formed of a semiconductor material including zinc, fluorine, oxygen, and nitrogen, or a semiconductor material including zinc, fluorine, and nitrogen. In other words, the channel layer C10 may include zinc fluorooxynitride or zinc fluoronitride. A material, properties, characteristics, and modifications of the channel layer C10 may be the same as or similar to those of the semiconductor materials 100 and 100' of FIGS. 1 and 2. A thickness of the channel layer C10 may range from about 10 nm to about 150 nm, for example, from about 20 nm to about 100 nm. However, a thickness range of the channel layer C10 may be changed.

An etch-stop layer ES10 may be disposed on the channel layer C10. A width of the etch-stop layer ES10 in the X-axis direction may be less than that of the channel layer C10. Both ends of the channel layer C10 may not be covered by the etch-stop layer ES10. The etch-stop layer ES10 may include, for example, silicon oxide, silicon oxynitride, silicon nitride, or an organic insulating material.

A source electrode S10 and a drain electrode D10 respectively contacting first and second regions (for example, both ends) of the channel layer C10 may be disposed on the gate insulating layer GI10. The source electrode S10 and the drain electrode D10 may each have a single-layer structure or a multi-layer structure. Materials of the source electrode S10 and the drain electrode D10 may be the same as or similar to that of the gate electrode G10. The source electrode S10 and the drain electrode D10 may each be formed of the same material as the gate electrode G10, or a different material than the gate electrode G10. For example, each of the source electrode S10 and/or the drain electrode D10 may be formed of a metal such as Ti, Pt, Ru, Au, Ag, Mo, Al, W, Cu, Nd, Cr, Ta, or an alloy including the metal, or a conductive oxide such as IZO, AZO, ITO, GZO, or ZTO, or a compound including the conductive oxide. The source electrode S10 may have a structure that contacts the first region (for example, one end) of the channel layer C10 and extends over one end of the etch-stop layer ES10, and the drain electrode D10 may have a structure that contacts the second region (for example, the other end) of the channel layer C10 and extends over the other end of the etch-stop layer ES10. The etch-stop layer ES10 may limit (and/or prevent) the channel layer C10 from being damaged during an etching process for forming the source electrode S10 and the drain electrode D10.

A passivation layer P10 that covers the etch-stop layer ES10, the source electrode S10, and the drain electrode D10 may be disposed on the gate insulating layer GI10. The passivation layer P10 may be a silicon oxide layer, a silicon oxynitride layer, a silicon nitride layer, or an organic layer, or may have a structure in which at least two of the silicon oxide layer, the silicon oxynitride layer, the silicon nitride layer, and the organic layer are stacked. For example, the passivation layer P10 may have a single-layer structure formed of silicon oxide or silicon nitride, or a multi-layer structure including a silicon oxide layer and a silicon nitride layer that is disposed on the silicon oxide layer. Also, the passivation layer P10 may have a multi-layer structure including three or more layers. In this case, the passivation layer P10 may include a silicon oxide layer, a silicon oxynitride layer, and a silicon nitride layer that are sequentially stacked. Thicknesses of the gate electrode G10, the gate insulating layer GI10, the source electrode and drain electrodes S10 and D10, and the passivation layer P10 may respectively range from about 50 to about 300 nm, from about 50 to about 400 nm, from about 10 to about 200 nm, and from about 50 to about 1200 nm. However, thickness ranges may be changed in some cases.

Whether to use the etch-stop layer ES10 may be determined according to a material of the channel layer C10 and materials of the source electrode S10 and the drain electrode D10. Alternatively, whether to use the etch-stop layer ES10 may be determined according to an etching process for forming the source electrode S10 and the drain electrode D10. Accordingly, in some cases, the etch-stop layer ES10 may be omitted from the TFT of FIG. 3, as shown in FIG. 4.

Figure 4:
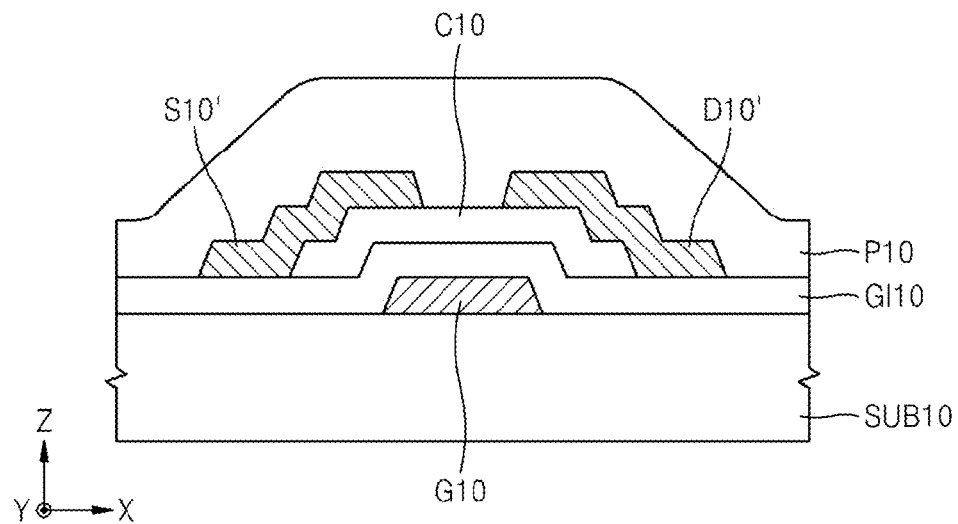
FIG. 4 is a cross-sectional view illustrating a TFT including a semiconductor material, according to example embodiments.

Referring to FIG. 4, a source electrode S10' may contact the first region (for example, one end) of the channel layer C10, and a drain electrode D10' may contact the second region (for example, the other end) of the channel layer C10. The source electrode S10' may extend to a portion of the gate insulating layer GI10 adjacent to the first region, and likewise, the drain electrode D10' may extend to a portion of the gate insulting layer GI10 adjacent to the second region. Except that the etch-stop layer ES10 (see FIG. 3) is not used and shapes of the source electrode S10' and the second drain electrode D10' are slightly different, a TFT of FIG. 4 may be similar to or the same as the TFT of FIG. 3. In the TFT of FIG. 4, a back-channel region may be exposed during an etching process. In this regard, the TFT of FIG. 4 may be referred to as a back-channel etch structure or an etch-back structure.

A field-effect mobility of each of the TFTs of FIGS. 3 and 4 may be equal to or greater than, for example, about 10 $cm^2/Vs$, or about 20 $cm^2/Vs$, or about 30 $cm^2/Vs$. The field-effect mobility may be increased to, for example, about 110 $cm^2/Vs$ or more. A subthreshold swing (S.S.) value of the TFT may be equal to or lower than, for example, about 0.95 V/dec or about 0.75 V/dec. The subthreshold swing (S.S.) value may be reduced to about 0.4 V/dec or less. As to the field-effect mobility and the subthreshold swing (S.S.) value (range), the TFTs according to example embodiments may have excellent switching characteristics and a high mobility. This is the same for TFTs of other embodiments that will be explained later.

Analysis/Evaluation (I)

Figure 5:
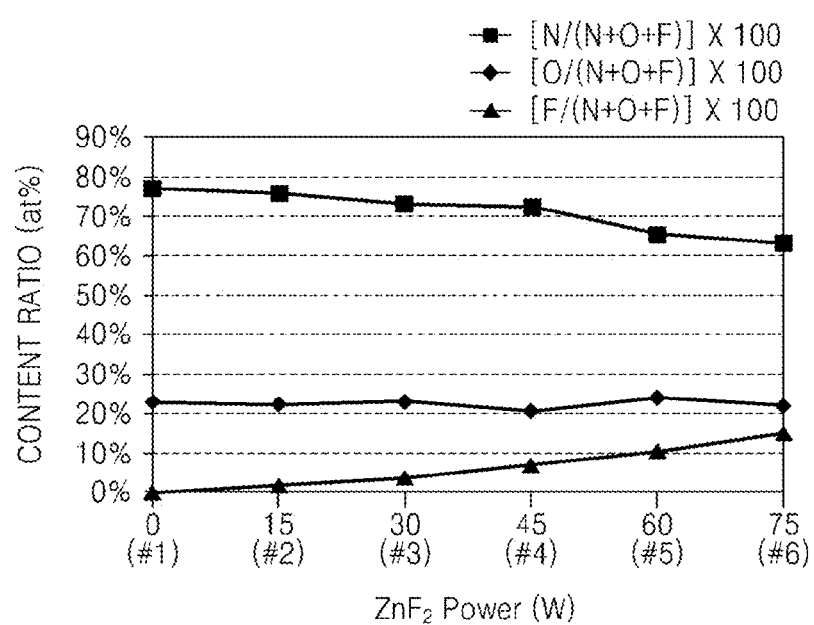
FIG. 5 is a graph illustrating a relationship between a condition for forming a semiconductor film and a composition ratio, according to example embodiments.

FIG. 5 is a graph illustrating a relationship between a condition for forming a semiconductor film (thin film) and a composition ratio, according to example embodiments. Semiconductor films (having a thickness of 500 Å) are formed by co-sputtering using a Zn target and a $ZnF_2$ target, in which a nitrogen ($N_2$) gas, an oxygen ($O_2$) gas, and an argon (Ar) gas are respectively supplied at flow rates of 100 sccm, 2 sccm, and 10 sccm. In the above method, the semiconductor films are formed by changing power for the $ZnF_2$ target to 0 W, 15 W, 30 W, 45 W, 60 W, and 75 W in a state where power for the Zn target is fixed to 300 W. Here, a pressure of a chamber is 0.4 Pa, and a temperature of a substrate is room temperature. A composition ratio is measured after each semiconductor film formed under these conditions is annealed at 200° C. for 1 hour. FIG. 5 is a graph illustrating a result obtained by using Rutherford backscattering spectrometry (RBS).

Referring to FIG. 5, it is found that as power for the ZnF$_2$ target (ZnF$_2$ power) increases, a content ratio of fluorine (F) of the semiconductor film, that is, [F/(N+O+F)]×100, increases. When ZnF$_2$ power is 15 W, a content ratio of fluorine is about 1.7 at %; when ZnF$_2$ power is 30 W, a content ratio of fluorine is about 3.8 at %; when ZnF$_2$ power is 45 W, a content ratio of fluorine is about 7.1 at %; when ZnF$_2$ power is 60 W, a content ratio of fluorine is about 10.4 at %; and when ZnF$_2$ power is 75 W, a content ratio of fluorine is about 15 at %. It is found that as power for the ZnF$_2$ (ZnF$_2$ power) increases, a content ratio of nitrogen (N) gradually decreases whereas a content ratio of oxygen (O) is maintained without being greatly changed. It is found that a content ratio of nitrogen decreases from about 77 at % to about 62 at %, and a content ratio of oxygen is maintained between 20 at % and 22 at %. Accordingly, in a measurement range, a change in power for the ZnF$_2$ target affects a content ratio of fluorine and a content ratio of nitrogen, and does not greatly affect a content ratio of oxygen. It is also found that the manufactured semiconductor film has a nitrogen-rich composition.

When power for the ZnF$_2$ target (ZnF$_2$ power) is 15 W, a Hall mobility p, a carrier density n, and a resistivity ρ of the manufactured semiconductor film are respectively 81.0 cm$^2$/Vs, 8.80×10$^{17}$/cm$^3$, and 0.08759 Ωcm. When power for the ZnF$_2$ target (ZnF$_2$ power) is 30 W, a Hall mobility μ, a carrier density n, and a resistivity ρ of the manufactured semiconductor film are respectively 60.3 cm$^2$/Vs, 3.15×10$^{16}$/cm$^3$, and 3.281 Ωcm. When power for the ZnF$_2$ target (ZnF$_2$ power) is 0 W, a Hall mobility μ, a carrier density n, and a resistivity ρ of the manufactured semiconductor film are respectively 78.7 cm$^2$/Vs, 2.15×10$^{18}$/cm$^3$, and 0.03693 Ωcm. When power for the ZnF$_2$ target (ZnF$_2$ power) is 0 W (comparative example), the manufactured semiconductor film may be a "zinc oxynitride (ZnO$_x$N$_y$)" thin film not including fluorine. Based on these measurement results, a variation in a Hall mobility, a carrier density, or the like of a semiconductor film according to ZnF$_2$ power may be estimated.

Figure 6:
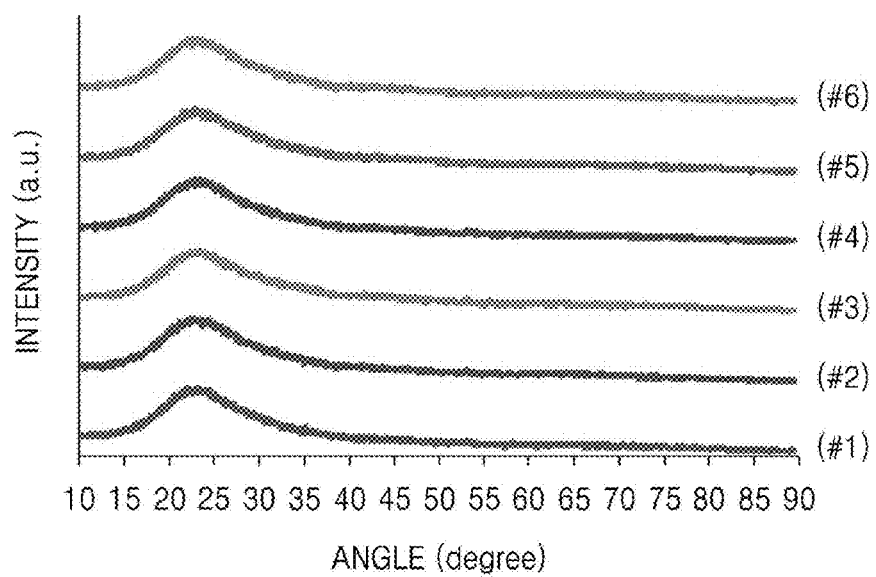
FIG. 6 is a graph illustrating a result of X-ray diffraction (XRD) analysis performed on semiconductor films of FIG. 5.

FIG. 6 is a graph illustrating a result of X-ray diffraction (XRD) analysis performed on the various semiconductor films of FIG. 5. In FIG. 6, sample numbers #1 through #6 respectively correspond to sample numbers #1 through #6 of FIG. 5.

Referring to FIG. 6, there are no sharp peaks for the semiconductor films. A broad peak at an angle 28 of about 23° is a sub-peak caused by a substrate (glass) on which each semiconductor film is formed. Accordingly, it is found that a semiconductor film according example embodiments has an amorphous phase.

FIGS. 7A through 7F are graphs illustrating transfer characteristics of a TFT using a semiconductor film, according to example embodiments. Transfer characteristics correspond to a relationship between a drain current I$_{DS}$ and a gate voltage V$_{GS}$. FIGS. 7A through 7F illustrate transfer characteristics of TFTs using thin films of the sample numbers #1 through #6 of FIG. 5 as channel layers. After forming a semiconductor film, an annealing process is performed on the semiconductor film at 300° C. for 1 hour, and a TFT including the semiconductor film is manufactured, and then an annealing process is performed on the TFT at 250° C. for 1 hour. Thereafter, characteristics of each TFT are evaluated. Four TFTs are manufactured under the same conditions and then transfer characteristics of the TFTs are evaluated. Accordingly, each graph includes 4 transfer curves. Here, each of the TFTs is manufactured by forming a gate electrode on a glass substrate, forming a gate insulating layer having a Si$_x$N$_y$/SiO$_2$ structure on the gate electrode, forming a channel layer of a semiconductor, and forming source/drain electrodes.

Referring to FIGS. 7A through 7F, it is found that an ON current ranges from about 10$^{-3}$ A to about 10$^{-2}$ A, an OFF current is lower than about 10$^{-13}$ A, and an ON/OFF current ratio is relatively high as about 10$^7$ or more. Thus, it is found that a TFT according to example embodiments has a low OFF current and a high ON/OFF current ratio, and satisfies requirements for TFT characteristics. In particular, as a content ratio of fluorine of a semiconductor film (e.g., channel layer) increases (that is, as ZnF$_2$ power increases), a slope between ON/OFF states gradually increases. This means that as a content ratio of fluorine of a semiconductor film (e.g., channel layer) increases, a subthreshold swing (S.S.) value decreases and ON/OFF switching characteristics are improved. When a subthreshold swing (S.S.) value is low, it may mean that a subthreshold slope is high.

Table 1 shows a field-effect mobility (cm$^2$/Vs) and a subthreshold swing (S.S.) value (V/dec) of each of the TFTs of FIGS. 7A through 7F.

TABLE 1

| Sample number | Field-effect mobility (μ) [cm$^2$/Vs] | Subthreshold swing value [V/dec] |
| --- | --- | --- |
| #1 | 82.6 ± 10.8 | 1.04 ± 0.06 |
| #2 | 73.3 ± 1.3 | 0.96 ± 0.00 |
| #3 | 69.7 ± 4.8 | 1.02 ± 0.02 |
| #4 | 48.1 ± 2.5 | 0.82 ± 0.09 |
| #5 | 22.7 ± 1.9 | 0.58 ± 0.07 |
| #6 | 10.4 ± 0.5 | 0.46 ± 0.03 |

Figure 7A:
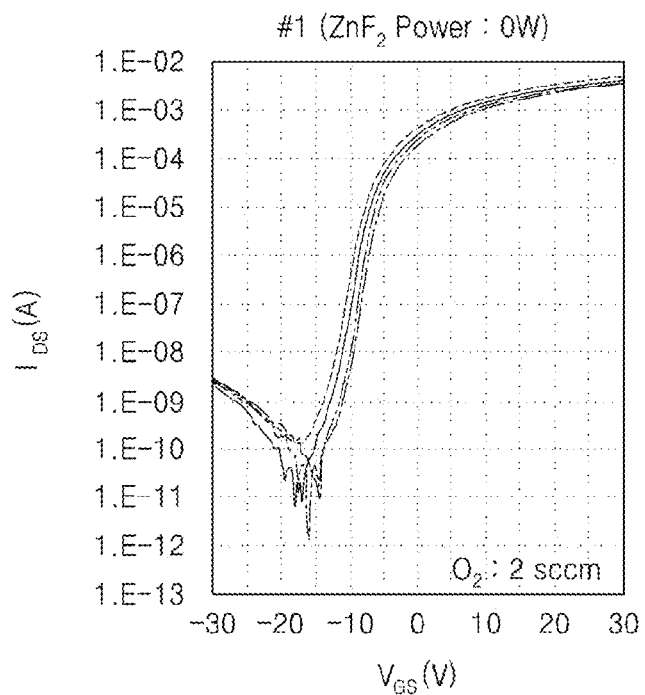
FIGS. 7A through 7F are graphs illustrating transfer characteristics of a TFT using a semiconductor film, according to example embodiments.
Figure 7B:
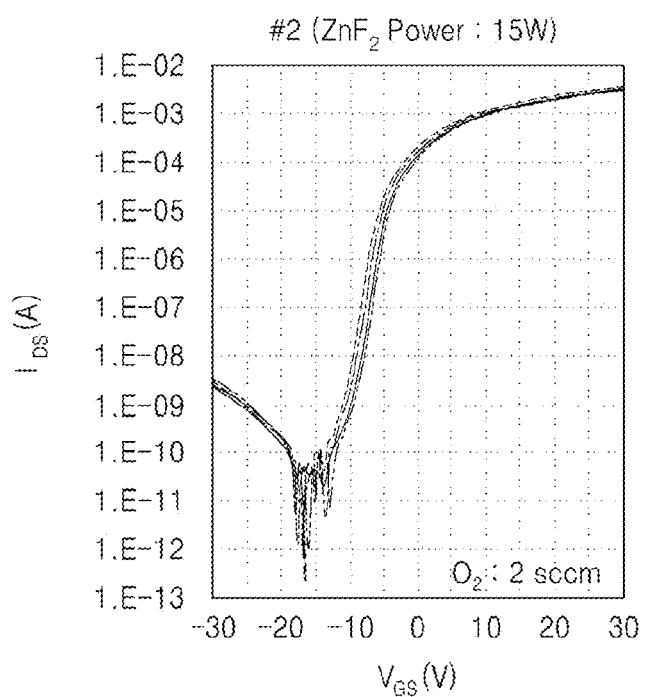
Figure 7C:
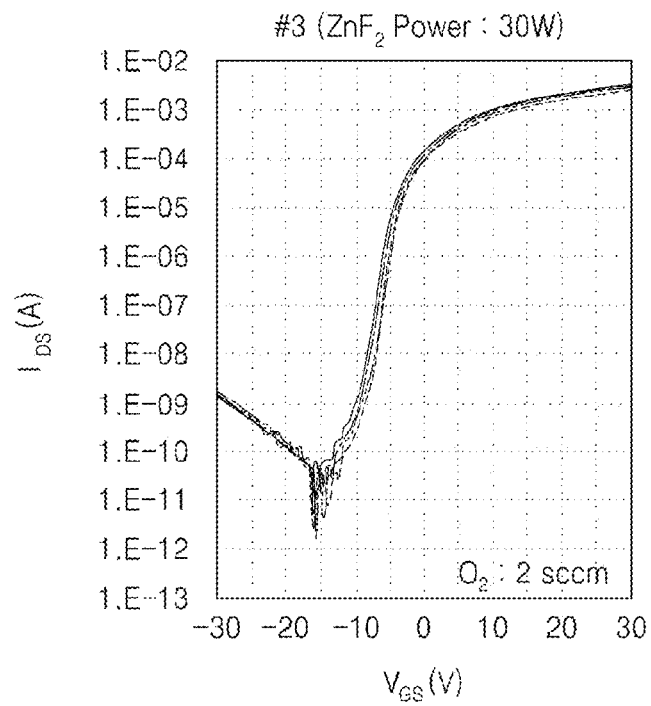
Figure 7D:
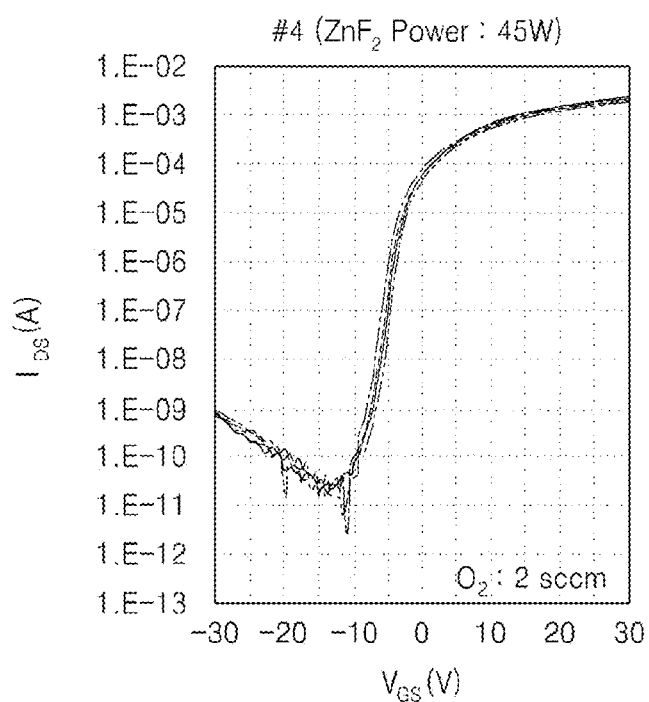
Figure 7E:
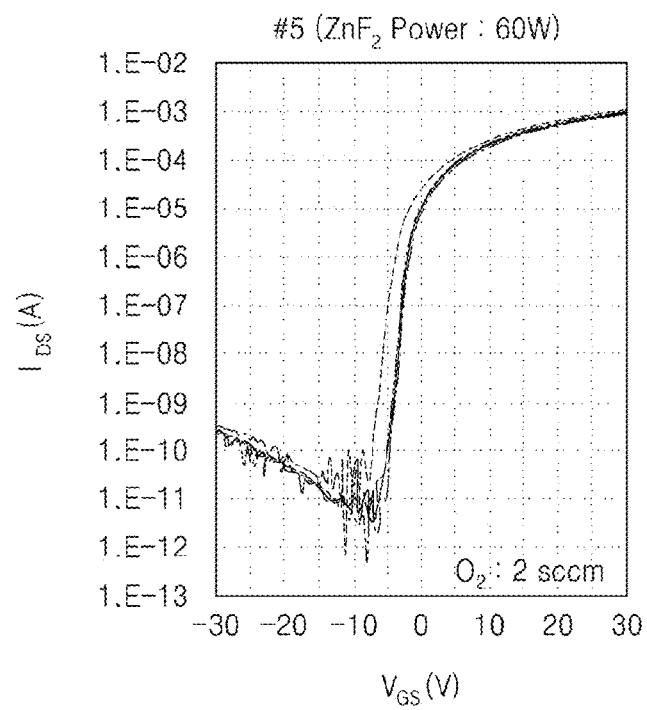
Figure 7F:
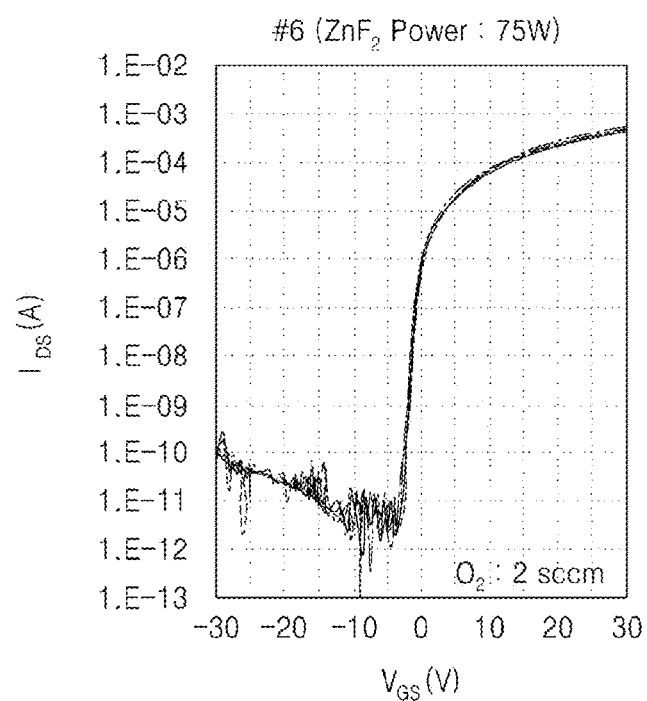

Meanwhile, as a content ratio of fluorine of a channel layer increases as shown from FIG. 7A toward FIG. 7F, a threshold voltage of a TFT gradually increases. That is, a threshold voltage of a TFT corresponding to FIG. 7A is −12.4±1.3 V, and a threshold voltage of a TFT corresponding to FIG. 7F is −2.0±0.1 V. Thus, a semiconductor including fluorine according to example embodiments may effectively increase a threshold voltage of a transistor.

Figure 8:
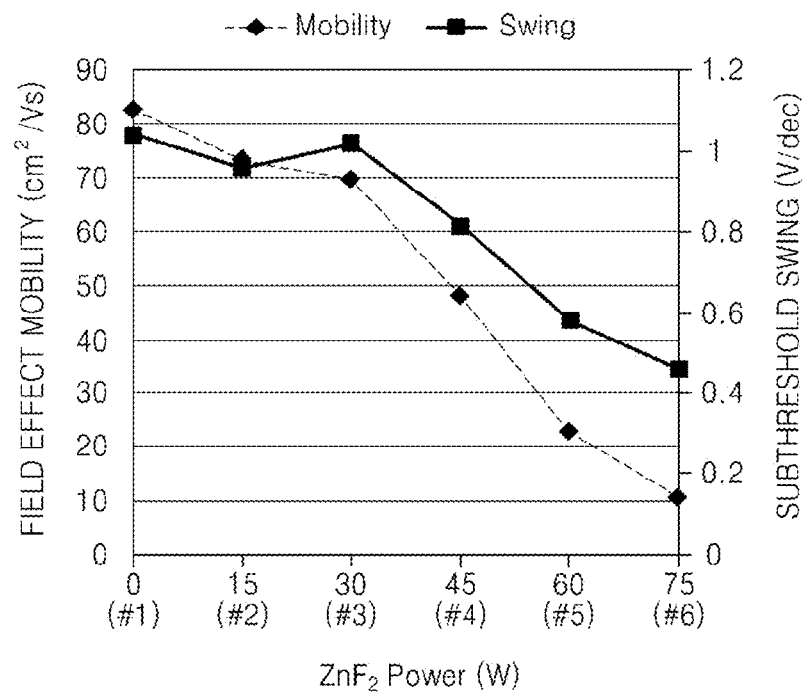
FIG. 8 is a graph illustrating a relationship between a condition for forming a semiconductor film (e.g., channel layer) of a TFT, and a field-effect mobility and a subthreshold swing value of the TFT, according to example embodiments.

FIG. 8 is a graph illustrating a relationship between a condition for forming a semiconductor film (e.g., channel layer) of a TFT, and a field-effect mobility and a subthreshold swing (S.S.) value of the TFT, according to example embodiments. Sample numbers #1 through #6 of FIG. 8 respectively correspond to the sample numbers #1 through #6 of FIG. 5. That is, FIG. 8 is a graph illustrating a result for TFTs using semiconductor films corresponding to the sample numbers #1 through #6 of FIG. 5 as channel layers. The result of FIG. 8 corresponds to the result of Table 1.

Referring to FIG. 8, as power for the ZnF$_2$ target increases, that is, as a content ratio of fluorine of a semiconductor film (e.g., channel layer) increases, a field-effect mobility and a subthreshold swing (S.S.) value of a TFT using the semiconductor film may decrease. When a subthreshold swing (S.S.) value decreases, it means that ON/OFF switching characteristics are improved. When a content ratio of fluorine of a semiconductor film increases, a carrier density of the semiconductor film may be appropriately controlled and a subthreshold swing (S.S.) value of a transfer curve may decrease. In more detail, when a content ratio of fluorine of a semiconductor film increases, nitrogen vacancies in the semiconductor film may decrease, and in this regard, a subthreshold swing (S.S.) value may decrease. Considering that when a mobility, that is, a field-effect mobility, of a transistor is equal to or greater than about 10 cm$^2$/Vs (or about 20 cm$^2$/Vs), the transistor may be appropriately applied to a high-speed and high-resolution display apparatus, a transistor according to example embodiments may be easily applied to a high-speed/ high-performance electronic device (display apparatus). Considering a field-effect mobility and a subthreshold swing (S.S.) value, a content ratio of fluorine of a semiconductor film may be appropriately selected to be equal to or greater than about 3 at %. In this case, a TFT having a high field-effect mobility equal to or greater than about 10 cm$^2$/Vs (or about 20 cm$^2$/Vs) and a low subthreshold swing value may be realized, and may be effectively used to realize a high-speed and high-resolution display apparatus.

A TFT using an existing semiconductor film, for example, a $ZnO_xN_y$ thin film, has a relatively high mobility but has a problem of a high subthreshold swing (S.S.) value. For example, when a ratio of oxygen to nitrogen is increased in order to control a threshold voltage, a carrier density is reduced but a subthreshold swing (S.S.) value is increased. Accordingly, it may be difficult to ensure a high mobility and excellent ON/OFF switching characteristics by using an existing semiconductor film.

Analysis/Evaluation (II)

Figure 9:
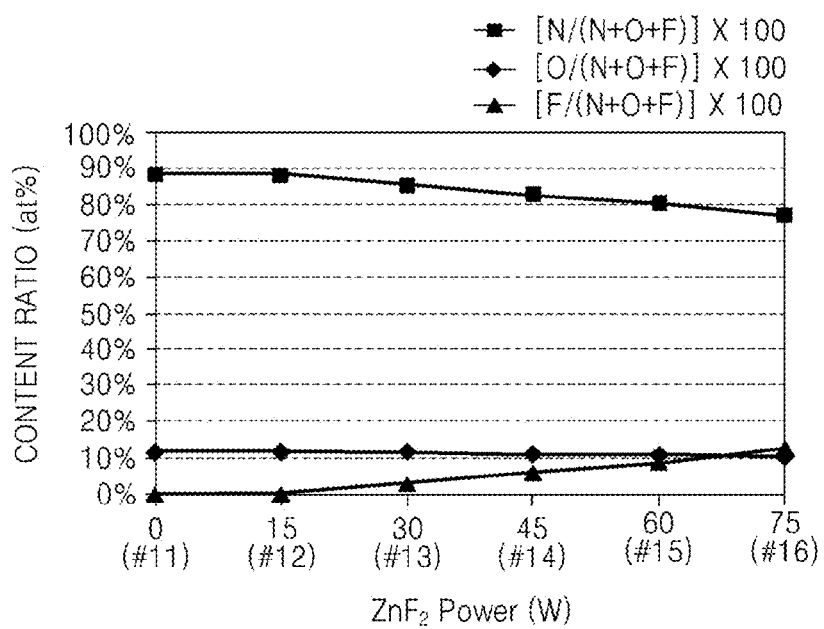
FIG. 9 is a graph illustrating a relationship between a condition for forming a semiconductor film and a composition ratio, according to example embodiments.

FIG. 9 is a graph illustrating a relationship between a condition for forming a semiconductor film and a composition ratio, according to example embodiments. The condition for forming the semiconductor film of FIG. 9 is the same as that of FIG. 5 except for flowing of an oxygen ($O_2$) gas at a flow rate of 1 sccm. That is, semiconductor films (having a thickness of 500 Å) are formed by co-sputtering using a Zn target and a $ZnF_2$ target, in which a nitrogen ($N_2$) gas, an oxygen ($O_2$) gas, and an argon (Ar) gas are respectively supplied at flow rates of 100 sccm, 1 sccm, and 10 sccm. In the above method, the semiconductor films are formed by changing power for the $ZnF_2$ target to 0 W, 15 W, 30 W, 45 W, 60 W, and 75 W in a state where power for the Zn target is fixed to 300 W. Here, a pressure of a chamber is 0.4 Pa, and a temperature of a substrate is a room temperature. A composition ratio is measured after annealing the semiconductor film formed under these conditions at 200° C. for 1 hour.

Referring to FIG. 9, as power for the $ZnF_2$ target ($ZnF_2$ power) increases, a content ratio of fluorine (F) of the semiconductor film increases. When $ZnF_2$ power is 30 W, a content ratio of fluorine is about 3.1 at %; when $ZnF_2$ power is 45 W, a content ratio of fluorine is about 6.1 at %; when $ZnF_2$ power is 60 W, a content ratio of fluorine is about 8.9 at %; and when $ZnF_2$ power is 75 W, a content ratio of fluorine is about 12.7 at %. As power for the $ZnF_2$ target ($ZnF_2$ power) increases, a content ratio of nitrogen (N) gradually decreases whereas a content ratio of oxygen (O) is maintained without being greatly changed. The content ratio of nitrogen decreases from about 90 at % to about 78 at %, and the content ratio of oxygen is maintained between about 10 at % to 11 at %. As a flow rate of an oxygen gas is decreased when compared to that of FIG. 5, a content ratio of oxygen is reduced to be about half of that of FIG. 5, and a content ratio of nitrogen increases. Meanwhile, a content ratio of fluorine is slightly reduced when compared to that of FIG. 5.

When power for the $ZnF_2$ target ($ZnF_2$ power) is 15 W, a Hall mobility p, a carrier density n, and a resistivity ρ of the manufactured semiconductor film are respectively 103.0 cm$^2$/Vs, 1.39×10$^{18}$/cm$^3$, and 0.04361 Ωcm. When power for the $ZnF_2$ target ($ZnF_2$ power) is 30 W, a Hall mobility µ, a carrier density n, and a resistivity ρ of the manufactured semiconductor film are respectively 86.8 cm$^2$/Vs, 2.61×10$^{17}$/cm$^3$, and 0.2752 Ωcm. When power for the $ZnF_2$ target ($ZnF_2$ power) is 45 W, a Hall mobility µ, a carrier density n, and a resistivity ρ of the manufactured semiconductor film are respectively 69.1 cm$^2$/Vs, 2.37×10$^{16}$/cm$^3$, and 3.808 Ωcm. When power for the $ZnF_2$ target ($ZnF_2$ power) is 0 W, a Hall mobility ρ, a carrier density n, and a resistivity ρ of the manufactured semiconductor film are respectively 105.0 cm$^2$/Vs, 4.06×10$^{18}$/cm$^3$, and 0.01458 Ωcm. Comparing these results with the results for the thin films of FIG. 5, it is found that as a flow rate of an oxygen gas decreases (that is, as a content ratio of nitrogen to oxygen of a semiconductor film increases), a Hall mobility of the semiconductor film increases and a carrier density increases as well. In other words, when a flow rate of an oxygen gas is reduced and a content ratio of nitrogen of a thin film is increased, a Hall mobility may be increased and a carrier density may also be increased.

Figure 10:
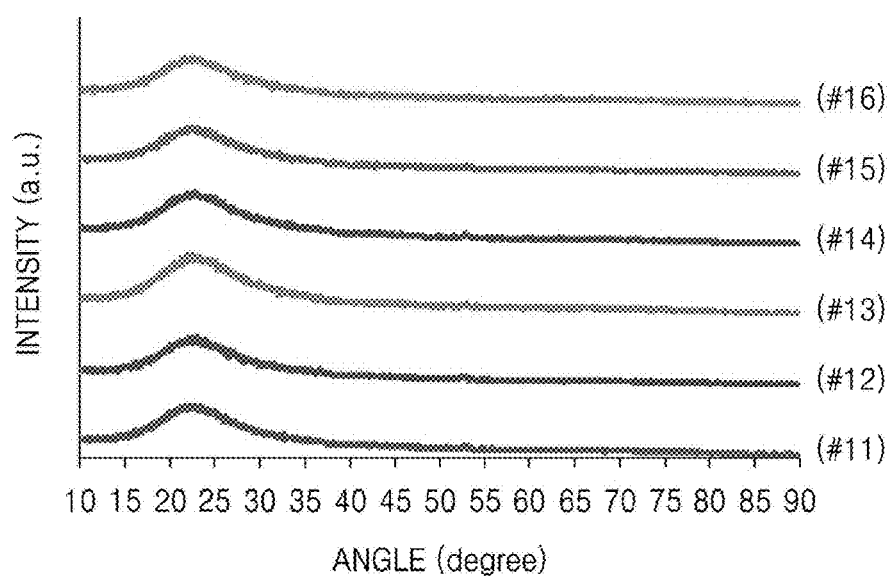
FIG. 10 is a graph illustrating a result of XRD analysis performed on semiconductor films of FIG. 9.

FIG. 10 is a graph illustrating a result of XRD analysis performed on the various semiconductor films of FIG. 9. Sample numbers #11 through #16 of FIG. 10 correspond to sample numbers #11 through #16 of FIG. 9.

The result of FIG. 10 is similar to that of FIG. 6. Accordingly, even when a flow rate of an oxygen gas is reduced to increase a content ratio of nitrogen in a thin film, a semiconductor film may have an amorphous phase in a measurement range.

FIGS. 11A through 11F are graphs illustrating transfer characteristics of a TFT using a semiconductor film, according to example embodiments. FIGS. 11A through 11F illustrate transfer characteristics of TFTs using thin films of the sample numbers #11 through #16 of FIG. 9 as channel layers. After forming a semiconductor film, an annealing process is performed on the semiconductor film at 300° C. for 1 hour, and a TFT including the semiconductor film is manufactured, and then an annealing process is performed on the TFT at 250° C. for 1 hour. Thereafter, characteristics of each TFT are evaluated. Four TFTs are manufactured under the same conditions and then transfer characteristics of the TFTs are evaluated. Accordingly, each graph includes 4 transfer curves. In this case, a basic configuration of each transistor is the same as that described with reference to FIGS. 7A through 7F.

Referring to FIGS. 11A through 11F, a TFT according to example embodiments has a low OFF current and a high ON/OFF current ratio, like in FIGS. 7A through 7F. In particular, as a content ratio of fluorine (F) of a semiconductor film (e.g., channel layer) increases, a subthreshold swing (S.S.) value decreases and ON/OFF switching characteristics are improved.

Table 2 shows a field-effect mobility (cm$^2$/Vs) and a subthreshold swing (S.S.) value (V/dec) of each of the TFTs of FIGS. 11A through 11F.

TABLE 2

| Sample number | Field-effect mobility (µ) [cm$^2$/Vs] | Subthreshold swing value [V/dec] |
| --- | --- | --- |
| #11 | 98.7 ± 3.6 | 0.93 ± 0.04 |
| #12 | 101.7 ± 1.2 | 0.80 ± 0.05 |
| #13 | 113.1 ± 9.4 | 0.69 ± 0.06 |
| #14 | 81.6 ± 3.4 | 0.62 ± 0.02 |
| #15 | 50.1 ± 4.5 | 0.46 ± 0.03 |
| #16 | 28.5 ± 1.6 | 0.35 ± 0.01 |

Figure 11A:
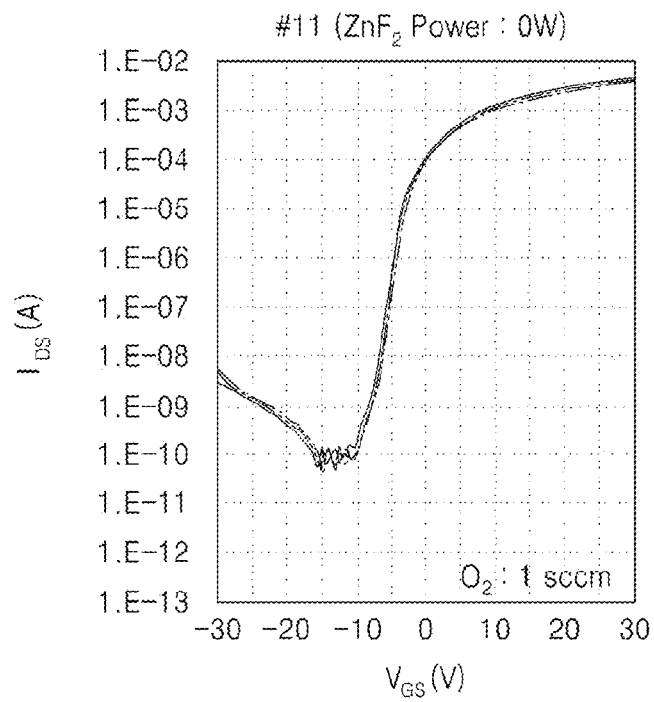
FIGS. 11A through 11F are graphs illustrating transfer characteristics of a TFT using a semiconductor film, according to example embodiments.
Figure 11B:
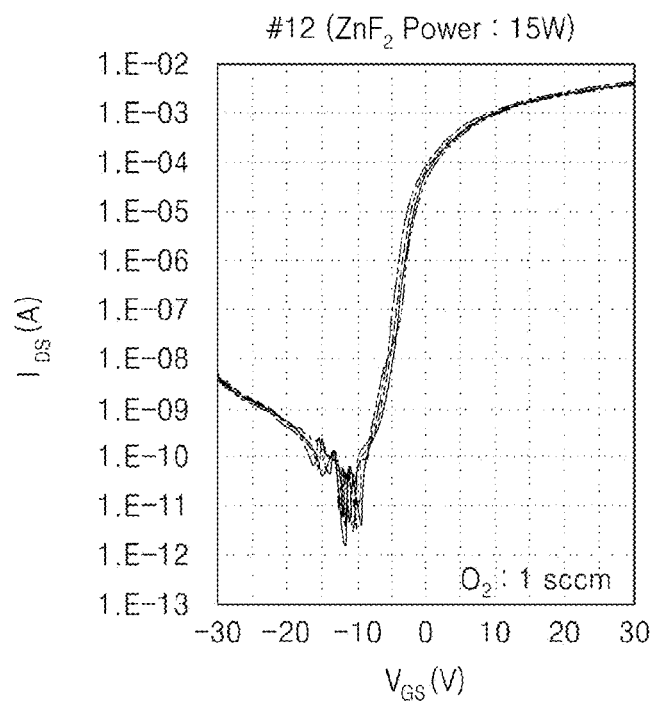
Figure 11C:
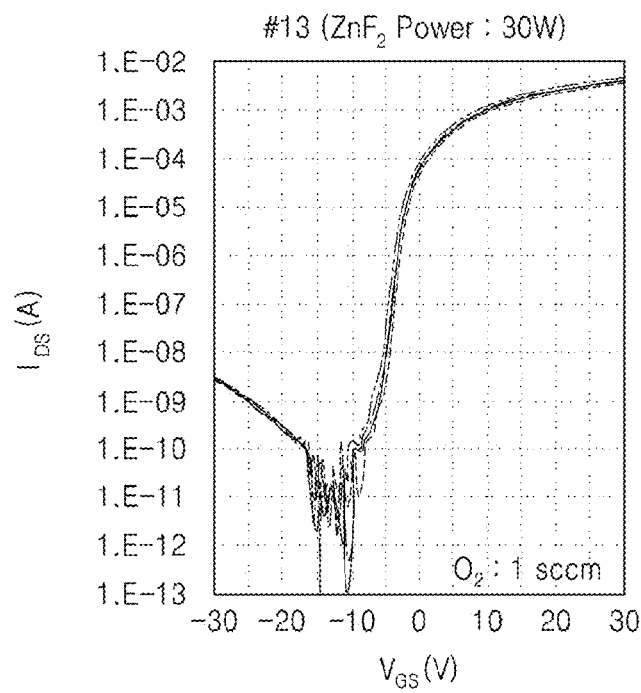
Figure 11D:
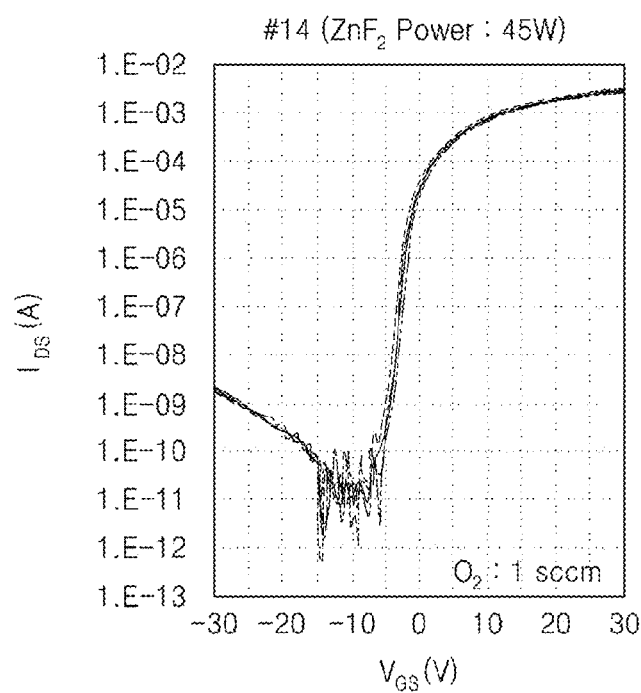
Figure 11E:
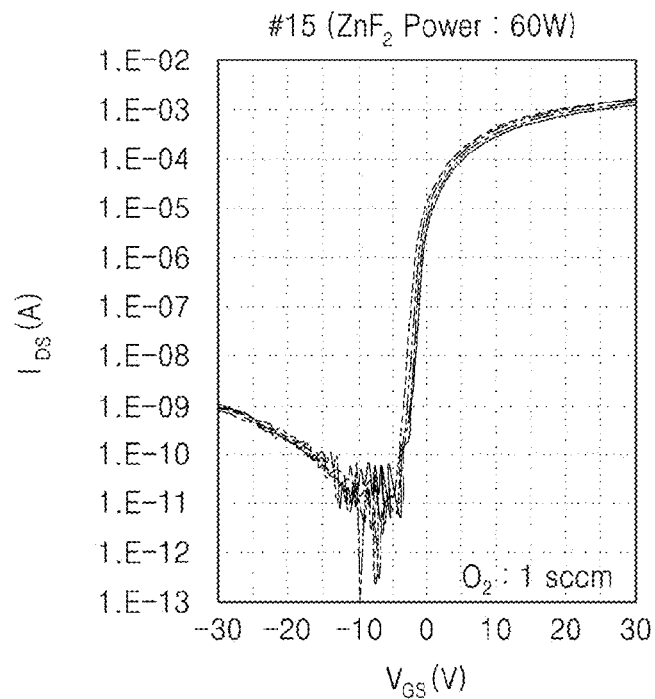
Figure 11F:
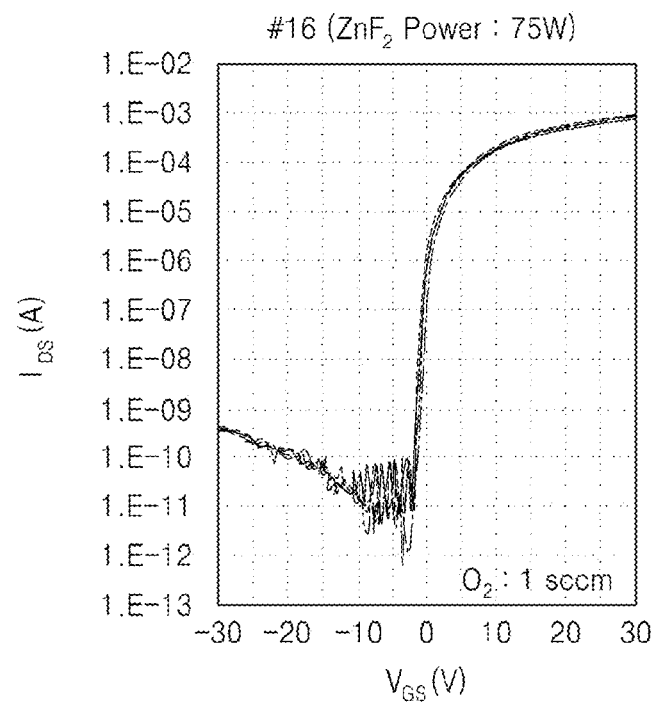

Meanwhile, as a content ratio of fluorine of a channel layer increases as shown from FIG. 11A toward FIG. 11F, a threshold voltage of a TFT gradually increases. That is, a threshold voltage of a TFT corresponding to FIG. 11A is −8.0±0.2 V, and a threshold voltage of a TFT corresponding to FIG. 11F is −1.3±0.2 V. When compared with the result of FIGS. 7A through 7F, it is found that when a flow rate of an oxygen gas is reduced to increase a content ratio of nitrogen in a thin film, a threshold voltage of a TFT may be greatly increased.

Figure 12:
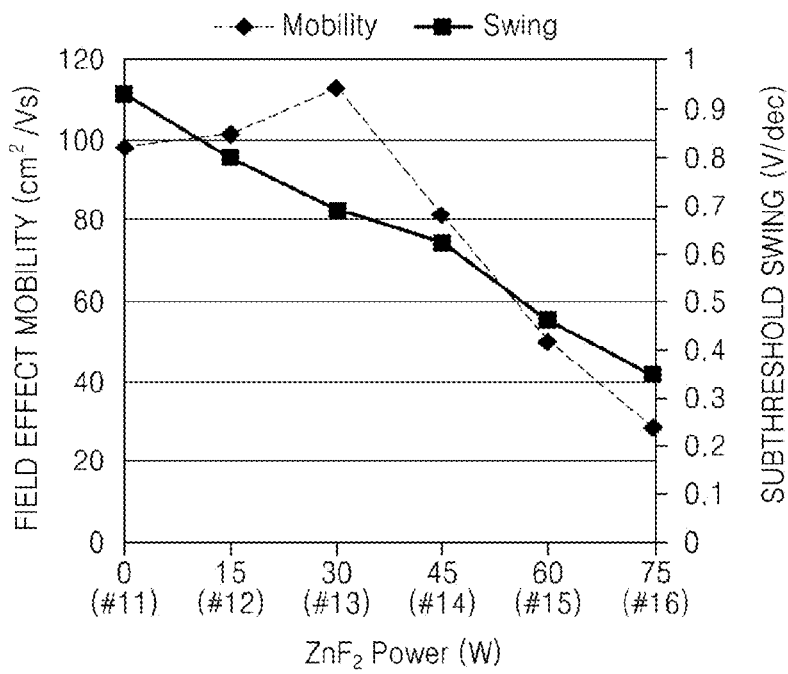
FIG. 12 is a graph illustrating a relationship between a condition for forming a semiconductor film (e.g., channel layer) of a TFT, and a field-effect mobility and a subthreshold swing value of the TFT, according to example embodiments.

FIG. 12 is a graph illustrating a relationship between a condition for forming a semiconductor film (e.g., channel layer) of a TFT, and a field-effect mobility and a subthreshold swing (S.S.) value of the TFT, according to example embodiments. Sample numbers #11 through #16 of FIG. 12 respectively correspond to the sample numbers #11 through #16 of FIG. 9. That is, FIG. 12 illustrates a result for TFTs using semiconductor films corresponding to the sample numbers #11 through #16 of FIG. 9 as channel layers. The result of FIG. 12 corresponds to the result of Table 2.

Referring to FIG. 12, as power for the $ZnF_2$ target increases, that is, a content ratio of fluorine of a semiconductor film (e.g., channel layer) increases, a subthreshold swing (S.S.) value decreases, like in FIG. 8. However, in FIG. 12, a subthreshold swing (S.S.) value is reduced to be about 0.35 V/dec, which is lower than that of FIG. 8. Accordingly, the embodiment of FIG. 12 may further reduce a subthreshold swing (S.S.) value, that is, may further improve ON/OFF characteristics.

As a content ratio of fluorine of a semiconductor film (e.g., channel layer) increases, a field-effect mobility of a TFT increases to some extent and then decreases. That is, as power for a $ZnF_2$ target increased from 0 W to 30 W, a field-effect mobility increased to a value equal to or greater than 110 $cm^2/Vs$ and decreased thereafter in which the power increased from 30 W to 75 W. Also, an average mobility value is higher than that of FIG. 8. Accordingly, the embodiment of FIG. 12 may further ensure a high mobility of a TFT, and may further ensure excellent switching characteristics by reducing a swing value. For example, when power for the $ZnF_2$ target is 60 W, a mobility of a TFT is about 50 $cm^2/Vs$ which is high and a swing value is about 0.45 V/dec which is low. Also, when power for the $ZnF_2$ target is 30 W, a mobility of a TFT is about 113 $cm^2/Vs$ which is very high, and a swing value is about 0.7 V/dec which is low. Such a TFT may be effectively used to realize a next generation high-performance/high-resolution/large-size display apparatus.

Analysis/Evaluation (III)

Figure 13A:
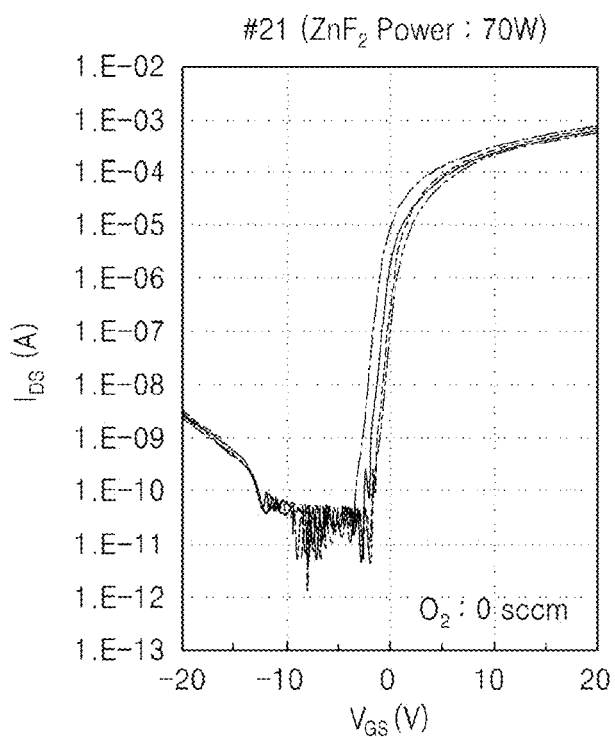
FIGS. 13A through 13C are graphs illustrating transfer characteristics of a TFT using a semiconductor film, according to example embodiments.
Figure 13B:
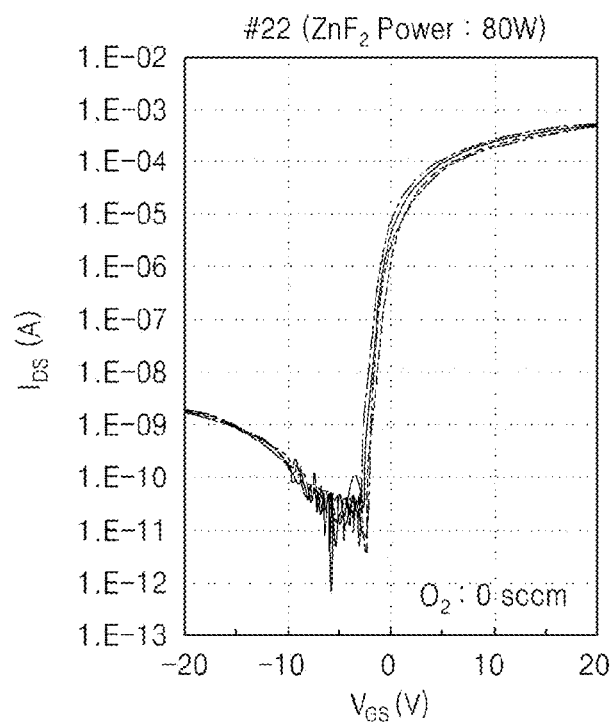
Figure 13C:
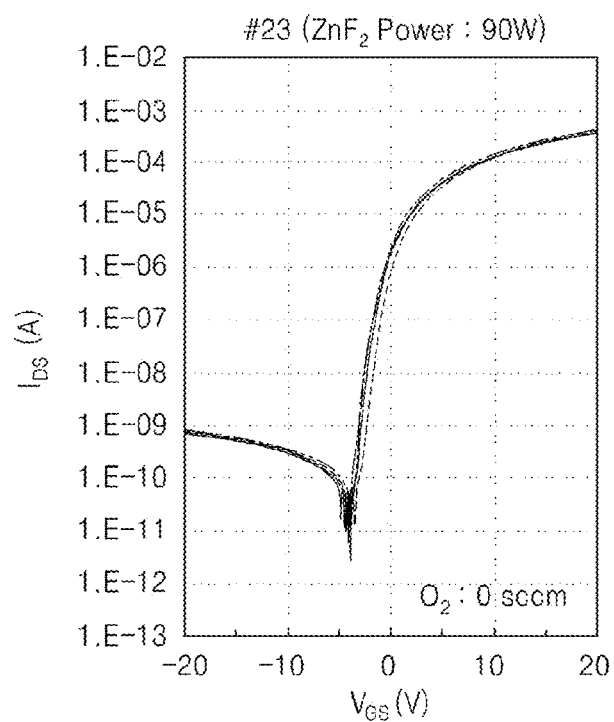

FIGS. 13A through 13C are graphs illustrating transfer characteristics of a TFT using a semiconductor film, according to example embodiments. FIGS. 13A through 13C illustrate transfer characteristics of a TFT using the semiconductor material 100' of FIG. 2. That is, FIGS. 13A through 13C illustrate a result with respect to a TFT using a semiconductor film as a channel layer, wherein the semiconductor film is formed to include zinc, fluorine, and nitrogen without using an oxygen ($O_2$) gas. When a semiconductor film (e.g., channel layer) used in the TFT of FIGS. 13A, 13B, and 13C is formed, power for the $ZnF_2$ target is 70 W, 80 W, and 90 W, respectively. A basic configuration of the TFT is the same as that described with reference to FIGS. 7A through 7F.

Referring to FIGS. 13A through 13C, it is found that a TFT according to example embodiments has relatively excellent characteristics, like in FIGS. 7A through 7F and FIGS. 11A through 11F.

Table 3 shows a field-effect mobility ($cm^2/Vs$) and a subthreshold swing (S.S.) value (V/dec) of the TFTs of FIGS. 13A through 13C.

TABLE 3

| Sample number | Field-effect mobility (μ) [cm$^2$/Vs] | Subthreshold swing value [V/dec] |
|---|---|---|
| #21 | 63.3 ± 2.6 | 0.41 ± 0.02 |
| #22 | 50.4 ± 4.6 | 0.37 ± 0.01 |
| #23 | 17.1 ± 1.4 | 0.47 ± 0.02 |

Meanwhile, a threshold voltage of a TFT corresponding to FIG. 13A is −0.86±0.93 V, a threshold voltage of a TFT corresponding to FIG. 13B is −0.92±0.42 V, and a threshold voltage of a TFT corresponding to FIG. 13C is −0.89±0.44 V.

Analysis/Evaluation (IV)

Figure 14:
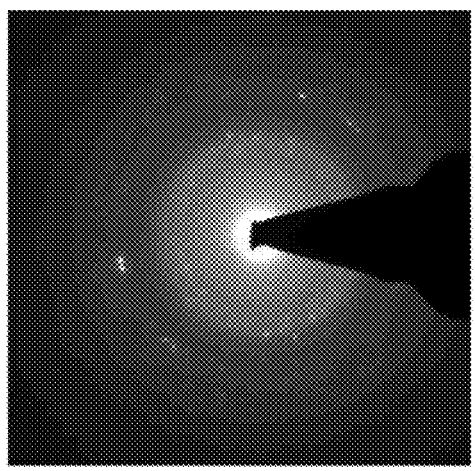
FIG. 14 is an image showing a nanodiffraction pattern obtained from a transmission electron microscope (TEM) image of a semiconductor film, according to example embodiments.

FIG. 14 is an image showing a nanodiffraction pattern obtained from a transmission electron microscope (TEM) image of a semiconductor film, according to example embodiments. That is, FIG. 14 illustrates a result obtained after performing TEM nanodiffraction on the semiconductor film. The semiconductor film includes zinc fluorooxynitride ($ZnF_xO_yN_z$). In general, a clear dot and dash pattern in the nanodiffraction pattern obtained from the TEM image indicates a crystalline phase and a wide circular band whose boundary is unclear and whose color is light indicates an amorphous phase.

Referring to FIG. 14, it is found that both a wide circular band and a dot pattern are shown. It means that a semiconductor film according to example embodiments may have both an amorphous phase and a crystalline phase (nanocrystalline phase). Since there are not many dot patterns, it is deemed that the amount of a crystalline phase (nanocrystalline phase) is not much and an amorphous phase dominates. However, the result of FIG. 14 is a non-limiting example, and a phase of a semiconductor film may vary according to a forming condition.

Transistor (II)

A configuration and modifications of a TFT according to example embodiments will now be explained in detail. That is, detailed structures and modifications of elements of TFTs of FIGS. 3 and 4, and TFTs according to other embodiments will be explained.

Figure 15:
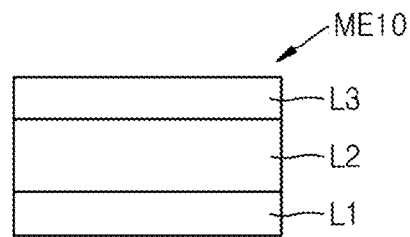
FIG. 15 is a cross-sectional view illustrating a multi-layer electrode structure of a gate electrode, a source electrode, and/or a drain electrode of a TFT, according to example embodiments.

FIG. 15 is a cross-sectional view illustrating a multi-layer electrode structure which may be applied to the gate electrode G10, the source electrodes S10 and S10', and/or the drain electrodes D10 and D10' of FIGS. 3 and 4.

Referring to FIG. 15, a multi-layer electrode ME10 may include a plurality of layers, for example, a first layer L1, a second layer L2, and a third layer L3. The first layer L1 may be a lower layer, the second layer L2 may be an intermediate layer, and the third layer L3 may be an upper layer. A resistivity of the second layer L2 may be lower than resistivities of the first and third layers L1 and L3. Thus, most of current may be flowed through the second layer L2. The first layer L1 and/or the third layer L3 may be used to increase an adhesive force and limit and/or prevent (suppress) diffusion. That is, the first layer L1 and/or the third layer L3 may act as an adhesive layer and a diffusion-preventing layer. For example, the first layer L1 and/or the third layer L3 may include titanium (Ti), molybdenum (Mo), or a combination thereof. The second layer L2 may include aluminum (Al), aluminum-neodymium (AlNd), copper (Cu), or a combination thereof. In more detail, the multi-layer electrode ME10 may have a structure such as Ti/Al/Ti, Ti/Cu/Ti, Mo/Al/Mo, Ti/AlNd/Ti, Mo/AlNd/Mo, or the like. Nd included in AlNd may suppress electromigration (EM). A thickness of the second layer L2 may be greater than thicknesses of the first layer L1 and the third layer L3. For example, thicknesses of the first layer L1, the second layer L2, and the third layer L3 may respectively range from about 500 Å to about 1000 Å, from about 1000 Å to about 2 μm, and from about 500 Å to about 1000 Å. In some cases, a desired (and/or alternatively predetermined) barrier layer (not shown) may be further disposed between the first layer L1 and the second layer L2 and/or between the second layer L2 and the third layer L3. For example, a barrier layer such as a TiN layer may be disposed between the first layer L1 and the second layer L2. Also, in some cases, at least one of the first layer L1 and the second layer L2 may not be provided. In addition, an electrode configuration of FIG. 15 may be changed in various ways.

When the multi-layer electrode ME10 configured as described with reference to FIG. 15 is applied to the gate electrode G10, the source electrodes S10 and S10', and/or the drain electrodes D10 and D10' of FIGS. 3 and 4, an adhesive force and diffusion-preventing characteristics may be improved, and excellent signal transmission characteristics may be ensured by suppressing resistance-capacitance (RC) delay. The electrode configuration of FIG. 15 may also be applied to TFTs of other embodiments which will be explained below. However, the detailed electrode structure of FIG. 15 is a non-limiting example, and may be changed in various ways. For example, an electrode having a single-layer structure, an electrode having a double-layer structure, or an electrode having a multi-layer structure including three layers or more may be used.

A detailed structure (multi-layer structure) which may be used for the gate insulating layer GI10 of FIGS. 3 and 4 will now be explained with reference to FIG. 16. That is, FIG. 16 is a cross-sectional view illustrating a detailed structure (multi-layer structure) of the gate insulating layer GI10.

Figure 16:
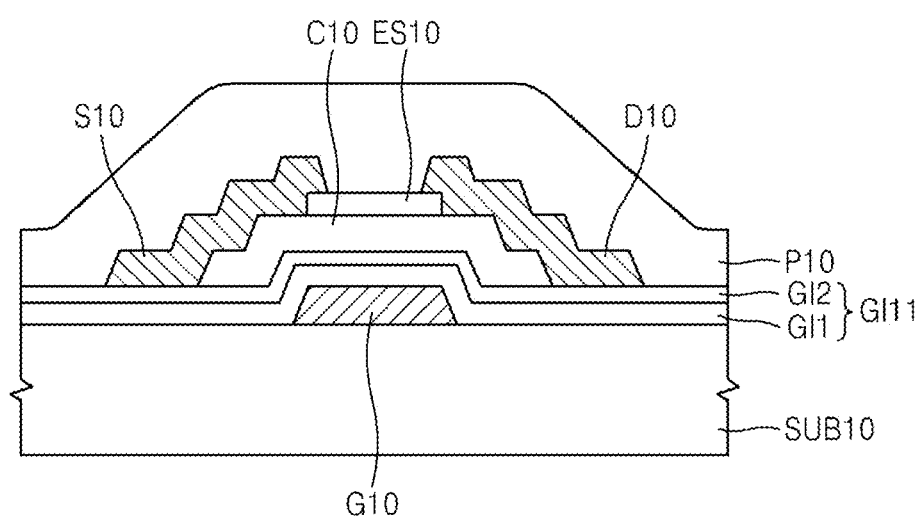
FIGS. 16 through 18 are cross-sectional views illustrating TFTs according to example embodiments.

Referring to FIG. 16, a gate insulating layer GI11 may include a silicon nitride layer GI1 and a silicon oxide layer GI2. The silicon nitride layer GI1 and the silicon oxide layer GI2 may be sequentially stacked on the gate electrode G10. The silicon nitride layer GI1 may be disposed between the gate electrode G10 and the silicon oxide layer GI2, and the silicon oxide layer GI2 may be disposed between the silicon nitride layer GI1 and the channel layer C10. The silicon nitride layer GI1 may contact the gate electrode G10, and the silicon oxide layer GI2 may contact the channel layer C10. The silicon oxide layer GI2 may be a material layer for improving interfacial characteristics between the channel layer C10 and the gate insulating layer GI11. That is, the silicon oxide layer GI2 may have excellent interfacial characteristics when contacting the channel layer C10. Since interfacial characteristics between the gate insulating layer GI11 and the channel layer C10 may affect transistor characteristics, it may be preferable that excellent interfacial characteristics are ensured between the gate insulating layer GI11 and the channel layer C10 as much as possible. Also, since the silicon oxide layer GI2 has a relatively large energy band gap, the silicon oxide layer GI2 may have a large valence band offset with respect to the channel layer C10. Accordingly, when the silicon oxide layer GI2 contacts the channel layer C10, an electrical barrier between the gate insulating layer GI11 and the channel layer G10 may be increased and hole injection may be suppressed. Since a film formation speed of the silicon nitride layer GI1 is relatively high and generation of particles is small when forming the silicon nitride layer GI1, it may be advantageous to a process of manufacturing a transistor and transistor characteristics. That is, when the silicon nitride layer GI1 is disposed between the gate electrode G10 and the silicon oxide layer GI2, generation of particles may be reduced when the gate insulating layer GI11 is formed, and a film formation speed of the gate insulating layer GI11 may be increased. Accordingly, when the gate insulating layer GI11 having the multi-layer structure of FIG. 16 is used, a TFT having excellent characteristics may be manufactured, when compared to a case where a gate insulating layer having a single-layer structure formed of only silicon nitride or silicon oxide is used.

The structure of the gate insulating layer GI11 of FIG. 16 may be applied to TFTs of other embodiments which will be explained below. In a TFT having a top gate structure in which a gate electrode is disposed above a channel layer, a gate insulating layer including a silicon oxide layer and a silicon nitride layer that are sequentially disposed from the channel layer toward the gate electrode may be used. However, a configuration of the gate insulating layer GI11 of FIG. 16 is a non-limiting example, and may be modified in various ways. For example, a material of the gate insulating layer GI11 may be changed, and a gate insulating layer having a single-layer structure or a gate insulating layer having a multi-layer structure including three or more layers may be used.

The passivation layer P10 of FIGS. 3 and 4 may have a single-layer structure or a multi-layer structure. For example, the passivation layer P10 of FIGS. 3 and 4 may be formed to have a single-layer structure or a multi-layer structure by using silicon oxide, silicon nitride, silicon oxynitride, or an organic insulating material. Since the passivation layer P10 does not directly contact the channel layer C10 in FIG. 3, the passivation layer P10 may be formed to have a single-layer structure formed of silicon nitride. Since the passivation layer P10 contacts the channel layer C10 in FIG. 4, the passivation layer P10 may be formed to have a multi-layer structure including a silicon oxide layer and a silicon nitride layer. In this case, the silicon oxide layer may contact the channel layer C10, and the silicon nitride layer may be disposed on the silicon oxide layer. Alternatively, the passivation layer P10 of FIGS. 3 and 4 may be formed to have a single-layer structure of silicon oxide. Alternatively, the passivation layer P10 may be formed to have a multi-layer structure including three layers or more.

Figure 17:
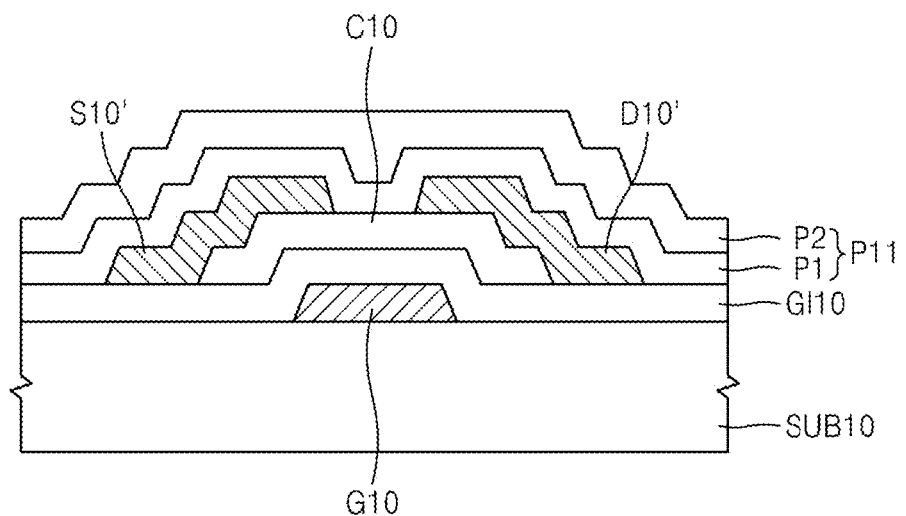
Figure 18:
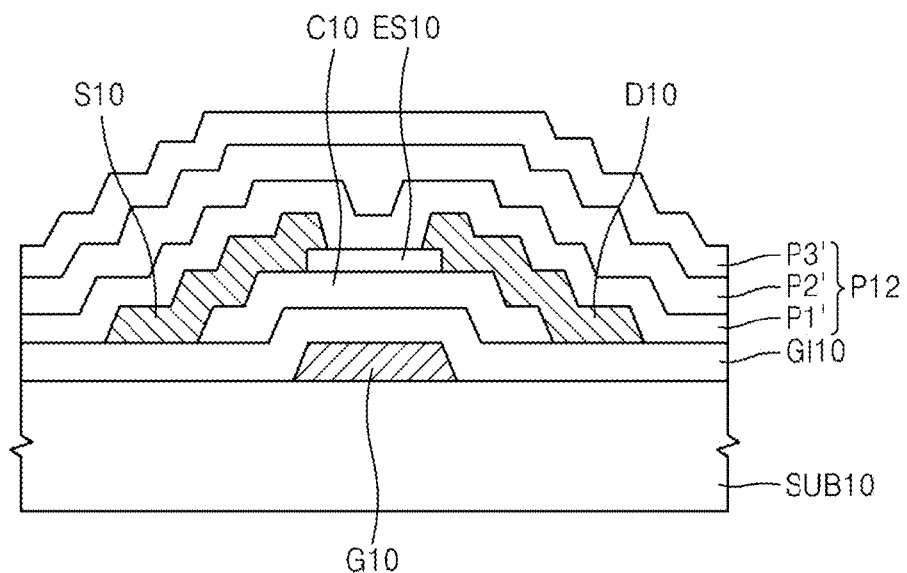

FIG. 17 is a cross-sectional view illustrating a case where a passivation layer P11 having a double-layer structure is used. FIG. 18 is a cross-sectional view illustrating a case where a passivation layer P12 having a three-layer structure is used. FIG. 17 illustrates a case where the passivation layer P11 having the double-layer structure is applied to the TFT having a back-channel etch structure of FIG. 4. FIG. 18 illustrates a case where the passivation layer P12 having the three-layer structure is applied to the TFT having an etch-stop structure of FIG. 3.

Referring to FIG. 17, the passivation layer P11 may include a first passivation layer P1 and a second passivation layer P2 that are sequentially stacked. The first passivation layer P1 may be a silicon oxide layer, and the second passivation layer P2 may be a silicon nitride layer. When the passivation layer P11 is formed on an exposed portion of the channel layer C10 between the source electrode S10' and the drain electrode D10', a silicon oxide layer may be used as the first passivation layer P1, and a silicon nitride layer may be used as the second passivation layer P2. When a silicon nitride passivation layer that contacts the channel layer C10 is formed, an electrical conductivity of the channel layer C10 may be increased to an undesired level due to an ammonia gas ($NH_3$) that is used to form the silicon nitride passivation layer. Accordingly, a silicon oxide layer may be used as the first passivation layer P1 that contacts the channel layer C10. A silicon nitride layer that may be used as the second passivation layer P2 may perform better than a silicon oxide layer in suppressing/preventing penetration of oxygen, moisture, or the like.

Referring to FIG. 18, the passivation layer P12 may include a first passivation layer P1', a second passivation layer P2', and a third passivation layer P3' that are sequentially stacked. The first passivation layer P1' may be a silicon oxide layer, the second passivation layer P2' may be a silicon oxynitride layer, and the third passivation layer P3' may be a silicon nitride layer. In this case, the second passivation layer P2' may function as a buffer layer (blocking layer), and may prevent or suppress penetration of plasma and hydrogen (H) when the third passivation layer (silicon nitride layer) P3' is formed. Considering the function of the second passivation layer P2' as the buffer layer (blocking layer), a thickness of the second passivation layer P2' may be equal to or greater than at least 100 nm. However, in some cases, a minimum thickness of the second passivation layer P2' may be changed. Also, when the first passivation layer (silicon oxide layer) P1' is a high-temperature deposition layer, the second passivation layer (silicon oxynitride layer) P2' may not be provided.

Although FIG. 17 illustrates a case where the passivation layer P11 having the double-layer structure is applied to FIG. 4 and FIG. 18 illustrates a case where the passivation layer P12 having the three-layer structure is applied to FIG. 3, the passivation layer P11 having the double-layer structure may be applied to the TFT of FIG. 3 and the passivation layer P12 having the three-layer structure may be applied to the TFT of FIG. 4. The passivation layers P11 and P12 of FIGS. 17 and 18 may be applied to transistors of other embodiments which will be explained below. Also, structures of the passivation layers P11 and P12 of FIGS. 17 and 18 are a non-limiting example, and may be modified in various ways.

Transistor (III)

Figure 19:
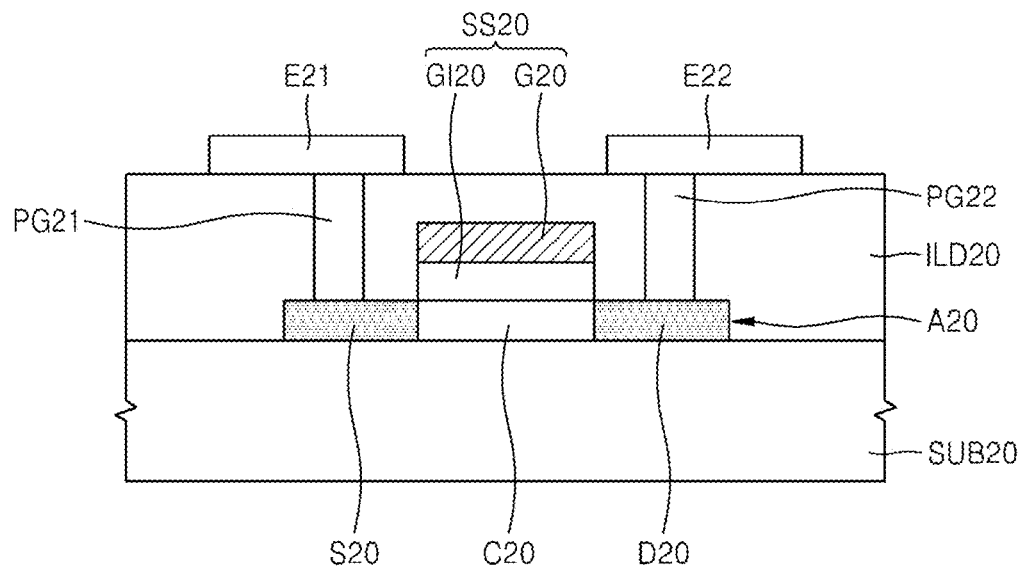
FIGS. 19 through 21 are cross-sectional views illustrating TFTs according to example embodiments.

FIG. 19 is a cross-sectional view illustrating a TFT according to example embodiments. The TFT of FIG. 19 is a TFT having a top gate structure in which a gate electrode G20 is disposed above a channel region C20.

Referring to FIG. 19, an active layer A20 may be disposed on a substrate SUB20. The substrate SUB20 may be a glass substrate, or any one of various substrates used in a common semiconductor device process such as a plastic substrate or a silicon substrate. The substrate SUB20 may be an inorganic substrate or an organic substrate, and may be transparent, opaque, or semitransparent. The active layer A20 may be a layer formed of a semiconductor material. The active layer A20 may be a layer formed of any of the semiconductor materials 100 and 100' of FIGS. 1 and 2. Accordingly, the active layer A20 may be formed of a semiconductor material including zinc, fluorine, oxygen, and nitrogen, or a semiconductor material including zinc, fluorine, and nitrogen. In other words, the active layer A20 may be formed of a semiconductor material including zinc fluorooxynitride or a semiconductor material including zinc fluoronitride. The active layer A20 may have the channel region C20 at or around a central portion thereof. A material, properties, characteristics, and modifications of the channel region C20 may be the same as or similar to those of the semiconductor materials 100 and 100' of FIGS. 1 and 2.

A stacked structure SS20 in which a gate insulating layer GI20 and a gate electrode G20 are sequentially stacked may be disposed on the channel region C20 of the active layer A20. A source region S20 and a drain region D20 may be disposed in the active layer A20 on both sides of the stacked structure SS20. The source region S20 and the drain region D20 may each have an electrical conductivity higher than that of the channel region C20. The source region S20 and the drain region D20 may be conductive regions. The source region S20 and the drain region D20 may be regions that are treated (processed) with plasma. For example, the source region S20 and the drain region D20 may be regions treated (processed) with plasma including hydrogen (H). When the active layer A20 on both sides of the stacked structure SS20 is treated (processed) by using plasma of a gas including hydrogen (H), the source region S20 and the drain region D20 having conductive property may be formed. In this case, the gas including the hydrogen (H) may be $NH_3$, $H_2$, or the like. When both end portions of the active layer A20 are treated (processed) by using the plasma of the gas including the hydrogen (H), the hydrogen may act as a carrier by entering the active layer A20. Also, the plasma of the hydrogen may remove an anion (oxygen or the like) of the active layer A20, and thus, an electrical conductivity of a plasma-treated region may be increased. Thus, the source region S20 and the drain region D20 may each include a region whose anion (oxygen or the like) concentration is relatively low. In other words, the source region S20 and the drain region D20 may each include a region whose cation concentration is relatively high, for example, a zinc-rich region.

An interlayer insulating layer ILD20 that covers the gate electrode G20, and the source region S20 and the drain region D20 may be disposed on the substrate SUB20. First and second electrodes E21 and E22 that are electrically connected to the source region S20 and the drain region D20 may be disposed on the interlayer insulating layer ILD20. The source region S20 and the first electrode E21 may be connected to each other through a conductive plug PG21, and the drain region D20 and the second electrode E22 may be connected to each other through a second conductive plug PG22. The first and second electrodes E21 and E22 may be respectively referred to as a source electrode and a drain electrode. Alternatively, the source region S20 and the drain region D20 may be referred to as a source electrode and a drain electrode. A passivation layer (not shown) that covers the first and second electrodes E21 and E22 may be further disposed on the interlayer insulating layer ILD20.

Although not shown in FIG. 19, a desired (and/or alternatively predetermined) underlayer may be disposed on the substrate SUB20, and the active layer A20 may be disposed on the underlayer. The underlayer may be an insulating layer such as an oxide layer. The oxide layer may be, for example, a silicon oxide layer. However, a material of the underlayer may be changed in various ways.

The TFT of FIG. 19 may have a self-aligned top gate structure in which positions of the source/drain regions S20 and D20 on both sides of the gate electrode G20 are automatically determined by a position of the gate electrode G20. In this case, the source region S20 and the drain region D20 may not overlap with the gate electrode G20. The self-aligned top gate structure may be advantageous in scaling down a device (transistor) and increasing an operating speed. In particular, since a parasitic capacitance may be reduced, RC delay may be suppressed and thus, an operating speed may be increased.

Figure 20:
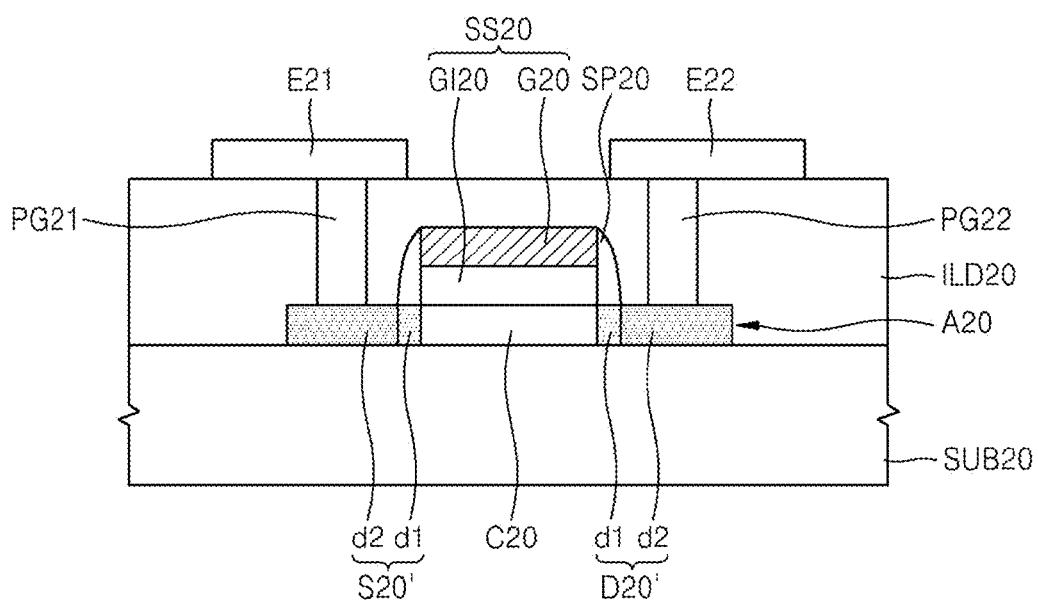

FIG. 20 is a cross-sectional view illustrating a TFT according to example embodiments. FIG. 20 is a modification of FIG. 19 and is different from FIG. 19 in that an insulating spacer SP20 is disposed on both side walls of the stacked structure SS20, and modified source/drain regions S20' and D20' are provided.

Referring to FIG. 20, the insulating spacer SP20 may be disposed on both side walls of the stacked structure 5520. The source region S20' and the drain region D20' may be provided in the active layer A20 on both sides of the stacked structure SS20. Each of the source region S20' and the drain region D20' may include two regions (hereinafter, referred to as first and second conductive regions) d1 and d2 having different electrical conductivities. The first conductive region d1 may be disposed adjacent to the channel region C20, that is, under each of the insulating spacers SP20. An electrical conductivity of the first conductive region d1 may be lower than an electrical conductivity of the second conductive region d2. The first conductive region d1 may be a region similar to a lightly doped drain (LDD) region. The source region S20' and the drain region D20' may be regions that are treated with plasma. A plasma treating time or number of the first conductive region d1 may be less than a plasma treating time or number of the second conductive region d2. In FIG. 20, the insulating spacer SP20 may be provided in order to form the first and second conductive regions d1 and d2 that are different from each other. In more detail, the first and second conductive regions d1 and d2 may be formed by forming the stacked structure SS20, performing a first plasma treatment on the active layer A20 at both sides of the stacked structure SS20, forming the insulating spacer SP20 on both side walls of the stacked structure SS20, and performing a second plasma treatment on the active layer A20 at both sides of the stacked structure SS20 and the insulating spacer SP20. In other words, the insulating spacer SP20 may be used to form an LDD structure in the active layer A20. Also, the insulating spacer SP20 may protect side walls of the gate electrode G20.

Figure 21:
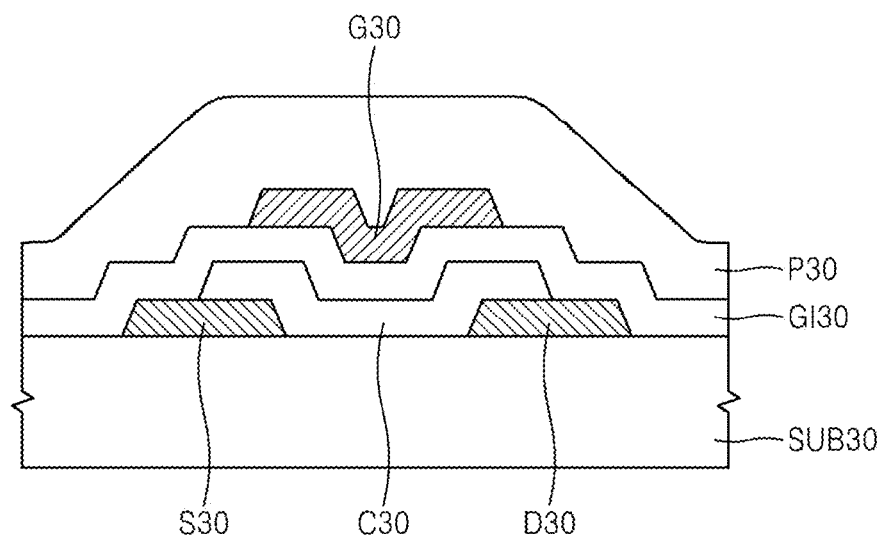

FIG. 21 is a cross-sectional view illustrating a TFT according to example embodiments. The TFT of FIG. 21 has another top gate structure.

Referring to FIG. 21, a source electrode S30 and a drain electrode D30 that are spaced apart from each other may be disposed on a substrate SUB30. A channel layer C30 that contacts the source electrode S30 and the drain electrode D30 may be disposed on the SUB30 between the source electrode S30 and the drain electrode D30. A material of the channel layer C30 may be the same as the semiconductor material C30 of FIG. 1 or the semiconductor material 100' of FIG. 2. That is, the channel layer C30 may be formed of a semiconductor material including zinc, fluorine, oxygen, and nitrogen, or a semiconductor material including zinc, fluorine, and nitrogen. In other words, the channel layer C30 may include zinc fluorooxynitride or zinc fluoronitride. A material, properties, characteristics, and modifications of the channel layer C30 may be the same as or similar to those of the semiconductor materials 100 and 100' of FIGS. 1 and 2. A thickness of the channel layer C30 may range from about 10 nm to about 150 nm, for example, from about 20 nm to about 100 nm. However, a thickness range of the channel layer C30 may be changed.

A gate insulating layer GI30 that covers the channel layer C30, and the source electrode S30 and the drain electrode D30 may be disposed on the substrate SUB30. A gate electrode G30 may be disposed on the gate insulating layer GI30. The gate electrode G30 may be disposed over the channel layer C30. A passivation layer P30 that covers the gate electrode G30 may be disposed on the gate insulating layer GI30.

Materials and thicknesses of the substrate SUB30, the source electrode S30, the drain electrode D30, the channel layer C30, the gate insulating layer GI30, the gate electrode G30, and the passivation layer P30 of FIG. 21 may be respectively the same as or similar to those of the substrate SUB10, the source electrode S10, the drain electrode D10, the channel layer C10, the gate insulating layer GI10, the gate electrode G10, and the passivation layer P10 of FIG. 3. A positional relationship between the channel layer C30, and the source electrode S30 and the drain electrode D30 in FIG. 21 may be modified as similar to that of FIG. 4. In other words, although the source electrode S30 and the drain electrode D30 are disposed to contact bottom surfaces of both ends of the channel layer C30 in FIG. 21, the channel layer C30 may be first formed and then the source electrode S30 and the drain electrode D30 that contact top surfaces of both ends of the channel layer C30 may be formed. In addition, the structure of FIG. 21 may be modified in various ways.

Method of Manufacturing Transistor

Methods of manufacturing TFTs including semiconductor materials according to example embodiments will now be explained.

FIGS. 22A through 22G are cross-sectional views for explaining a method of manufacturing a TFT, according to example embodiments. The method of FIGS. 22A through 22G is a method of manufacturing a TFT having a bottom gate structure.

Figure 22A:
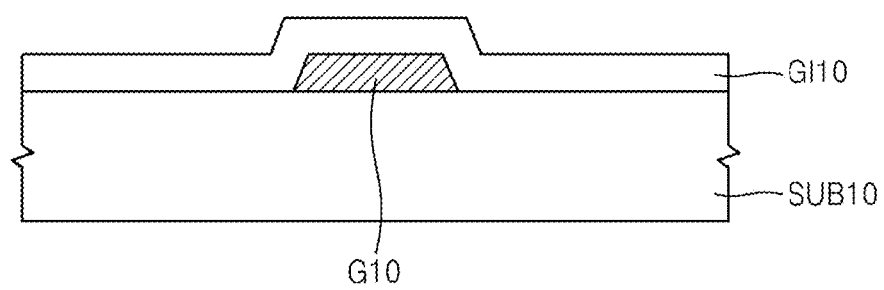
FIGS. 22A through 22G are cross-sectional views for explaining a method of manufacturing a TFT, according to example embodiments.

Referring to FIG. 22A, a gate electrode G10 may be formed on a substrate SUB10, and a gate insulating layer GI10 that covers the gate electrode G10 may be formed. The substrate SUB10 may be a glass substrate, or any one of various substrates used in a common semiconductor device process such as a plastic substrate or a silicon substrate. The substrate SUB10 may be an inorganic substrate or an organic substrate, and may be transparent, opaque, or semitransparent. The gate electrode G10 may be formed of a general electrode material (e.g., a metal, an alloy, conductive metal oxide, conductive metal nitride, or the like). For example, the gate electrode G10 may be formed of a metal such as Ti, Pt, Ru, Au, Ag, Mo, Al, W, Cu, Nd, Cr, Ta, or an alloy including the metal, or a conductive oxide such as In—Zn—O (IZO), Al—Zn—O (AZO), In—Sn—O (ITO), Ga—Zn—O (GZO), or Zn—Sn—O (ZTO), or a compound including the conductive oxide. The gate electrode G10 may have a single-layer structure or a multi-layer structure. The gate insulating layer GI10 may be formed of silicon oxide, silicon oxynitride, or silicon nitride, or may be formed of another material, for example, a high-k material ($HfO_2$, $Al_2O_3$, or the like) layer having a dielectric constant higher than that of silicon nitride. The gate insulating layer GI10 may be formed to have a structure in which at least two layers from among a silicon oxide layer, a silicon oxynitride layer, a silicon nitride layer, and a high-k material layer are stacked. In more detail, the gate insulating layer GI10 may be formed to have a structure in which a silicon nitride layer and a silicon oxide layer are stacked, for example. In this case, the gate insulating layer GI10 may be formed by sequentially stacking the silicon nitride layer and the silicon oxide layer on the gate electrode G10.

Figure 22B:
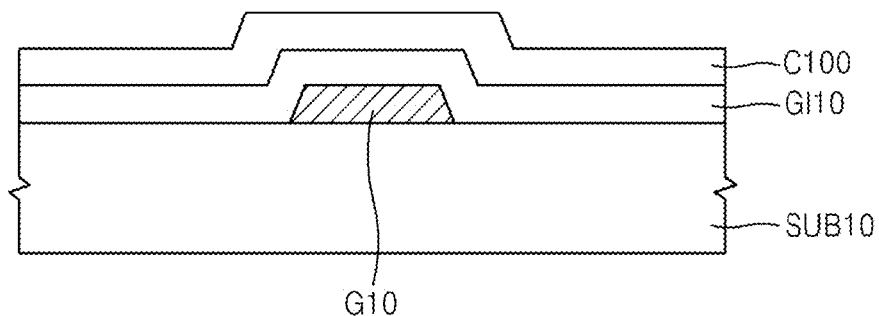

Referring to FIG. 22B, a channel semiconductor layer C100 may be formed on the gate insulating layer GI10. The channel semiconductor layer C100 may be formed of a semiconductor material including zinc, fluorine, oxygen, and nitrogen, or a semiconductor material including zinc, fluorine, and nitrogen. In other words, the channel semiconductor layer C100 may be formed of a semiconductor material including zinc fluorooxynitride, or a semiconductor material including zinc fluoronitride. A thickness of the channel semiconductor layer C100 may range from about 10 nm to about 150 nm, for example, from about 20 nm to about 100 nm. In some cases, an appropriate thickness range may be changed.

The channel semiconductor layer C100 may be deposited by using PVD such as sputtering. The sputtering may be reactive sputtering. Also, the sputtering may be co-sputtering using a plurality of targets. The sputtering may be performed in a process chamber. When the channel semiconductor layer C100 is formed by using co-sputtering, a Zn target and a $ZnF_2$ target may be used. In this case, a nitrogen ($N_2$) gas or an oxygen ($O_2$) gas may be used as a reactive gas, and additionally, an argon (Ar) gas may be further used. The nitrogen gas may be a source of nitrogen, and the argon gas may be a source of oxygen. The argon gas may act as a carrier gas. Also, the argon gas may improve deposition efficiency by generating plasma. A flow rate of the nitrogen gas may range from about 20 sccm to about 200 sccm, and a flow rate of the oxygen gas may range from about 1 sccm to about 15 sccm. A flow rate of the argon gas may range from about 1 sccm to about 100 sccm. A supply amount of the nitrogen gas may be greater than a supply amount of the oxygen gas. For example, a supply amount of the nitrogen gas may be 10 times more greater, or 50 times or more greater than a supply amount of the oxygen gas. Since a reactivity of oxygen to zinc is higher than that of nitrogen to zinc, the channel semiconductor layer C100 that is nitrogen-rich may be obtained by supplying the nitrogen gas more than the oxygen gas. Also, a supply amount of the nitrogen gas may be greater than a supply amount of the argon gas. The sputtering may be performed at room temperature or a relatively low temperature (for example, 25 to 300° C.). In other words, when the channel semiconductor layer C100 is formed by using the sputtering, a temperature of a substrate may be maintained at room temperature or a relatively low temperature (for example, 25 to 300° C.). A pressure of a reaction chamber may range from about 0.05 Pa to about 15 Pa. Sputtering power for the Zn target may range from about tens to thousands of W, and sputtering power for the $ZnF_2$ target may range from about several to thousands of W. A content ratio of fluorine (F) of the channel semiconductor layer C100 may be adjusted by adjusting the sputtering power for the $ZnF_2$ target. As the sputtering power for the $ZnF_2$ target increases, a content ratio of fluorine of the channel semiconductor layer C100 may increase. Also, when the oxygen ($O_2$) gas is not used in the method of forming the channel semiconductor layer C100, that is, when a flow rate of the oxygen ($O_2$) gas is 0 sccm, the channel semiconductor layer C100 formed of zinc, fluorine, and nitrogen may be formed.

The detailed process conditions may be a non-limiting example, and may vary according to a sputtering system. Also, the method of forming the channel semiconductor layer C100 may be changed in various ways. For example, the channel semiconductor layer C100 may be formed by using a method other than the sputtering, for example, MOCVD. Alternatively, the channel semiconductor layer C100 may be formed by using another method such as CVD, ALD, or evaporation.

Figure 22C:
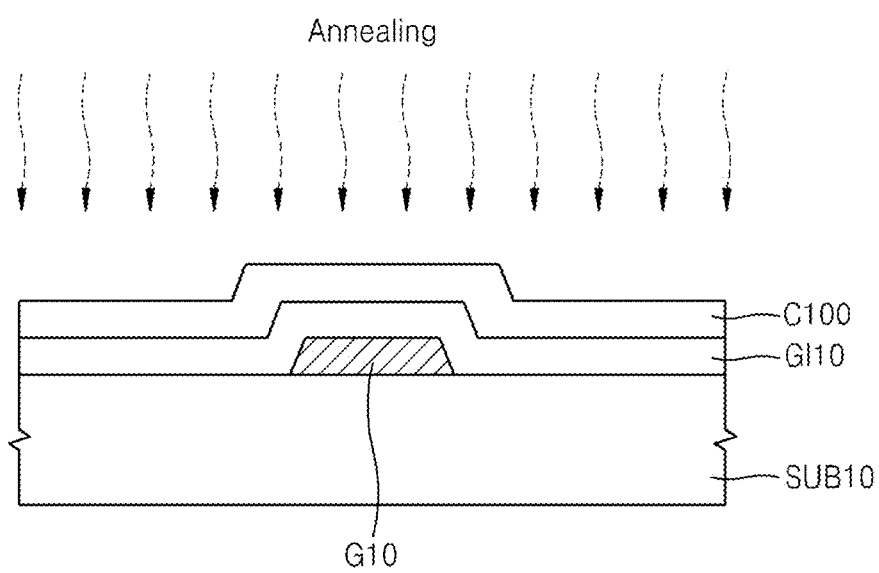
Figure 22D:
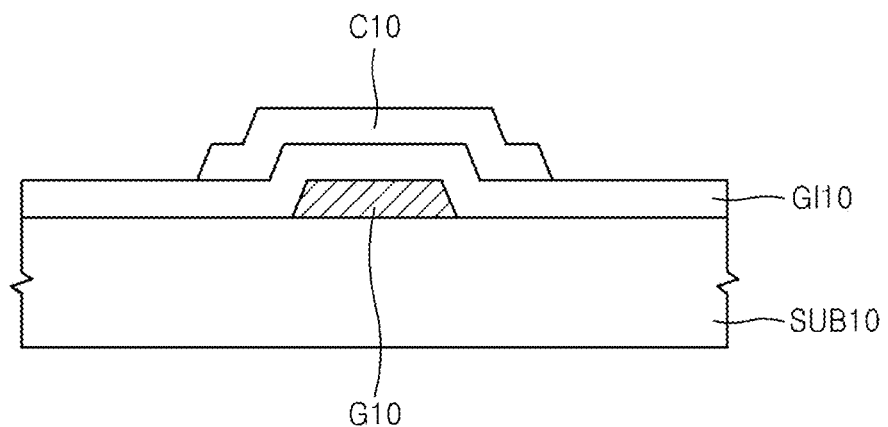

Referring to FIG. 22C, the channel semiconductor layer C100 may be annealed (that is, subjected to heat treatment). The annealing may be performed at a temperature equal to or lower than about 450° C., for example, a temperature ranging from about 150° C. to about 450° C. Also, the annealing may be performed in a $N_2$, $O_2$, or air atmosphere. Due to the annealing, the channel semiconductor layer C100 may be stabilized. Also, a protection film (not shown) may be thinly formed on a surface of the channel semiconductor layer C100 due to the annealing. The protection film may be a surface oxide film or an oxygen-rich material film. The protection film may have a density higher than that of the channel semiconductor layer C100 disposed under the protection film. A time when the annealing is performed may be changed. For example, the annealing may be performed after the channel semiconductor layer C100 is patterned as shown in FIG. 22D. However, the annealing is optional, and thus may not be performed in some cases.

Referring to FIG. 22D, a channel layer C10 may be formed by patterning the channel semiconductor layer C100. The channel layer C10 may be disposed above the gate electrode G10. That is, the channel layer C10 may be disposed to face the gate electrode G10. A material, properties, characteristics, and modifications of the channel layer C10 may be the same as or similar to those of the semiconductor materials 100 and 100' of FIGS. 1 and 2.

Figure 22E:
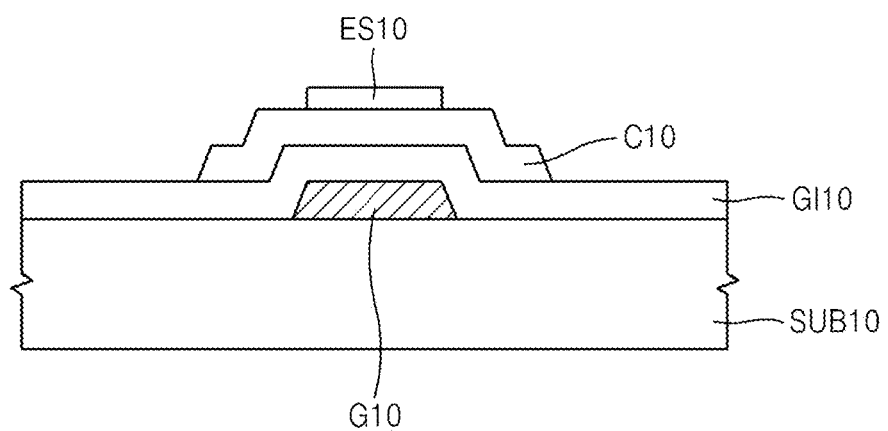

Referring to FIG. 22E, an etch-stop layer ES10 may be formed on the channel layer C10. The etch-stop layer ES10 may be formed at or around a central portion of the channel layer C10. Accordingly, portions of the channel layer C10 on both sides of the etch-stop layer ES10 may not be covered by the etch-stop layer ES10 to be exposed. The etch-stop layer ES10 may be formed of, for example, silicon oxide, silicon oxynitride, silicon nitride, or an organic insulating material.

Figure 22F:
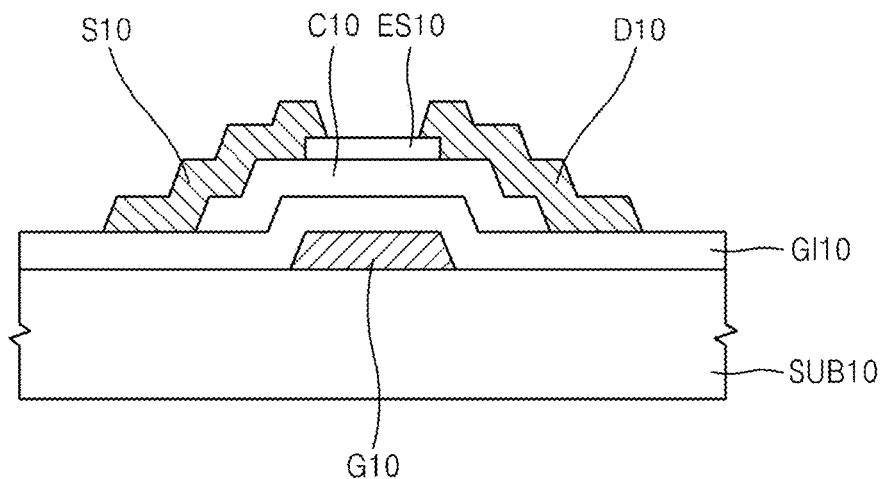

Referring to FIG. 22F, a source electrode S10 and a drain electrode D10 that respectively contact first and second regions (for example, both ends) of the channel layer C10 may be formed on the gate insulating layer GI10. The source electrode S10 may have a structure that contacts the first region (one end) and extends over one end of the etch-stop layer ES10. The drain electrode D10 may have a structure that contacts the second region (the other end) and extends over the other end of the etch-stop layer ES10. A desired (and/or alternatively predetermined) conductive film that covers the channel layer C10 and the etch-stop layer ES10 may be formed on the gate insulating layer GI10, and then the source electrode S10 and the drain electrode D10 may be formed by patterning (etching) the conductive film. In this case, the etch-stop layer ES10 may limit (and/or prevent) the channel layer C10 from being damaged during an etching process for forming the source electrode S10 and the drain electrode D10. The source electrode S10 and the drain electrode D10 may each be formed of the same material as the gate electrode G10, or a different material than the gate electrode G10. For example, each of the source electrode S10 and the drain electrode D10 may be formed of a metal such as Ti, Pt, Ru, Au, Ag, Mo, Al, W, Cu, Nd, Cr, Ta, or an alloy including the metal, or a conductive oxide such as IZO, AZO, ITO, GZO, or ZTO, or a compound including the conductive oxide. The source electrode S10 and the drain electrode D10 may each be formed to have a single-layer structure or a multi-layer structure.

Figure 22G:
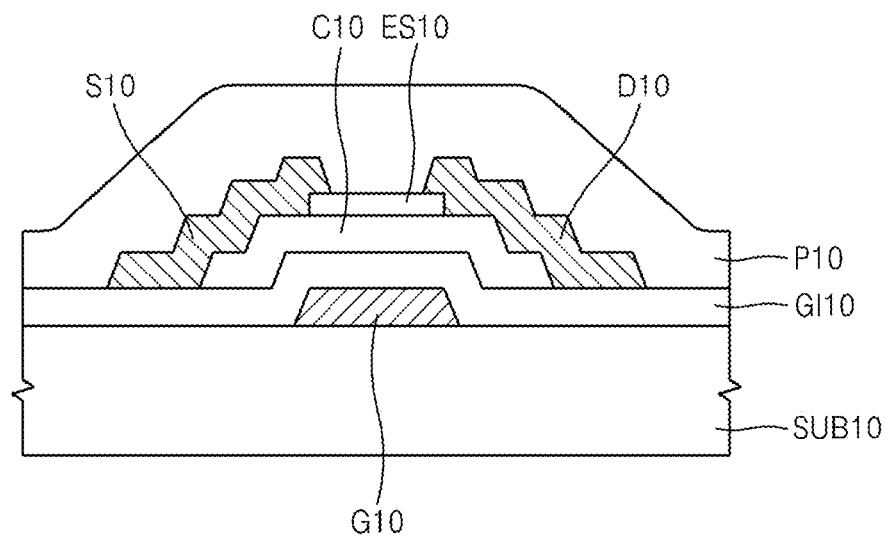

Referring to FIG. 22G, a passivation layer P10 that covers the etch-stop layer ES10, and the source electrode S10 and the drain electrode D10 may be formed on the gate insulating layer GI10. The passivation layer P10 may be a silicon oxide layer, a silicon oxynitride layer, a silicon nitride layer, or an organic insulating layer, or may be formed to have a structure in which at least two layers from among a silicon oxide layer, a silicon oxynitride layer, a silicon nitride layer, and an organic insulating layer are stacked. Annealing may be performed before or after the passivation layer P10 is formed.

The method of FIGS. 22A through 22G is a method of manufacturing the TFT of FIG. 3. The TFT of FIG. 4 may be manufactured by using a modification of the method of FIGS. 22A through 22G. For example, the source electrode S10 and the drain electrode D10 may be formed without forming the etch-stop layer ES10 of FIG. 22E. Whether to use the etch-stop layer ES10 may be determined according to a material of the channel layer C10 and materials of the source electrode S10 and the drain electrode D10. Alternatively, whether to use the etch-stop layer ES10 may be determined according to an etching process for forming the source electrode S10 and the drain electrode D10. Accordingly, in some cases, a subsequent process may be performed without the etch-stop layer ES10, and thus, the TFT of FIG. 4 may be manufactured. In addition, the method of FIGS. 22A through 22G may be modified in various ways.

FIGS. 23A through 23E are cross-sectional views for explaining a method of manufacturing a TFT, according to example embodiments. The method of FIGS. 23A through 23E is a method of manufacturing a TFT having a top gate structure.

Figure 23A:
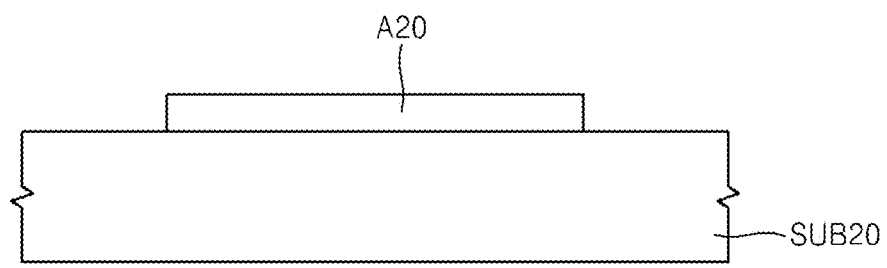
FIGS. 23A through 23E are cross-sectional views for explaining a method of manufacturing a TFT, according to example embodiments.

Referring to FIG. 23A, an active layer A20 may be formed on a substrate SUB20. The active layer A20 may be formed of a semiconductor material according to example embodiments. A method of forming the active layer A20 may be the same as or similar to the method of forming the channel layer C10 described with reference to FIGS. 22B through 22D.

Accordingly, the active layer A20 may be formed of a semiconductor material including zinc, fluorine, oxygen, and nitrogen, or a semiconductor material including zinc, fluorine, and nitrogen. In other words, the active layer A20 may be formed of a semiconductor material including zinc fluorooxynitride, or a semiconductor material including zinc fluoronitride. A thickness of the active layer A20 may range from about 10 nm to about 150 nm, for example, from about 20 nm to 100 nm. However, in some cases, an appropriate thickness range may be changed. A material, properties, characteristics, and modifications of the active layer A20 may be the same as or similar to those of the semiconductor materials 100 and 100' of FIGS. 1 and 2.

Figure 23B:
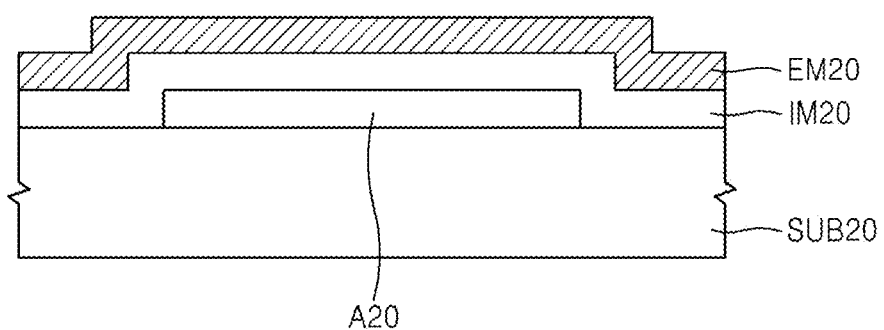

Referring to FIG. 23B, an insulating material layer IM20 that covers the active layer A20 may be formed on the substrate SUB20. The insulating material layer IM20 may be formed of silicon oxide, silicon oxynitride, or silicon nitride, or may be formed of another material, for example, a high-k material ($HfO_2$, $Al_2O_3$, or the like) layer having a dielectric constant higher than that of silicon nitride. The insulating material layer IM20 may be formed to have a structure in which at least two layers from among a silicon oxide layer, a silicon oxynitride layer, a silicon nitride layer, and a high-k material layer are stacked. In more detail, the insulating material layer IM20 may be formed of a silicon oxide layer, or may be formed to have a structure in which a silicon oxide layer and a silicon nitride layer are sequentially stacked. Next, an electrode material layer EM20 may be formed on the insulating material layer IM20.

Figure 23C:
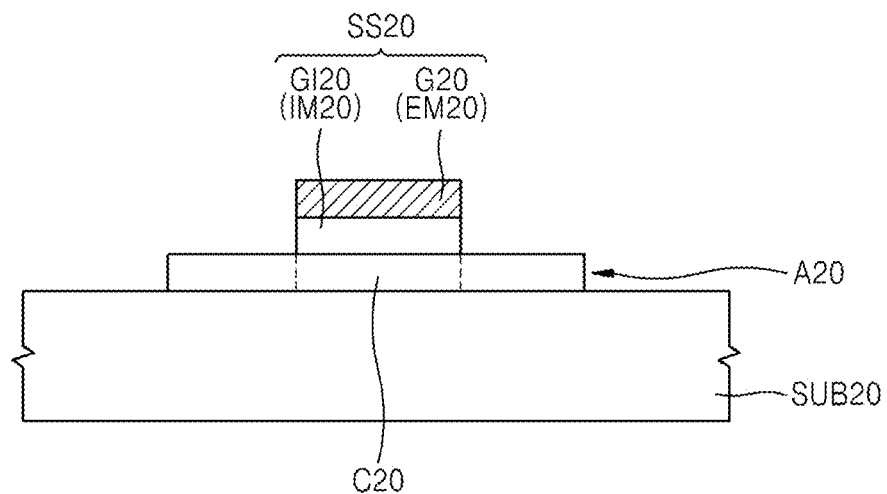

Referring to FIG. 23C, a stacked structure SS20 may be formed at or around a central portion of the active layer A20 by sequentially etching the electrode material layer EM20 and the insulating material layer IM20. A portion of the active layer A20 under the stacked structure SS20 may be the channel region C20. In FIG. 23C, reference numeral GI20 denotes an etched insulating material layer (hereinafter, referred to as a gate insulating layer), and G20 denotes an etched electrode material layer (hereinafter, referred to as a gate electrode).

Figure 23D:
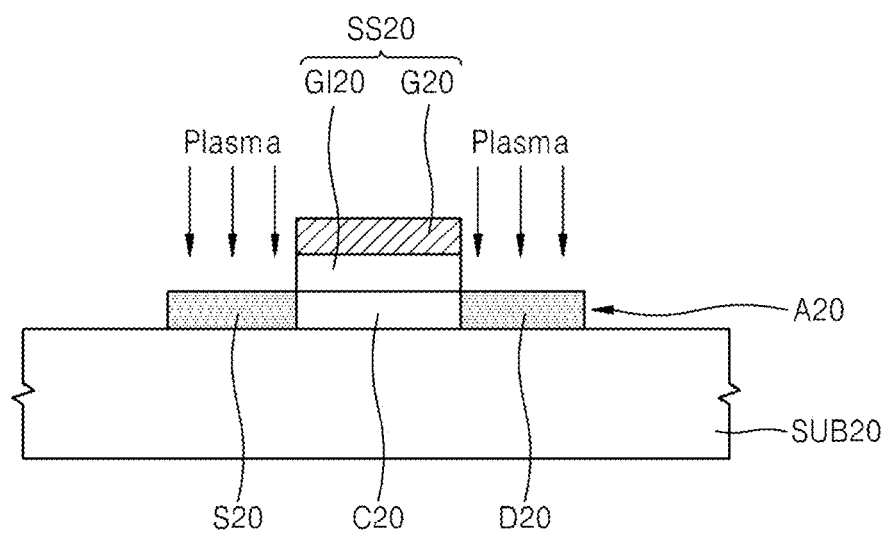

Referring to FIG. 23D, a source region S20 and a drain region D20 may be formed in the active layer A20 at both sides of the stacked structure SS20 by treating (processing) the active layer A20 at both sides of the stacked structure SS20 with plasma. The plasma may be, for example, plasma of a gas including hydrogen (H). The gas including the hydrogen (H) may be $NH_3$, $H_2$, or the like. When both end portions of the active layer A20 are treated (processed) by using the plasma of the gas including the hydrogen, the hydrogen may act as a carrier by entering the active layer A230. Also, the plasma of the hydrogen may remove an anion (oxygen or the like) of the active layer A20, and thus, an electrical conductivity of a plasma-treated region may be increased. Thus, the source region S20 and the drain region D20 may each include a region whose anion (oxygen or the like) concentration is relatively low. In other words, the source region S20 and the drain region D20 may each include a region whose cation concentration is relatively high, for example, a zinc-rich region. The method of forming the source region S20 and the drain region D20 is a non-limiting example, and may be changed in various ways.

Figure 23E:
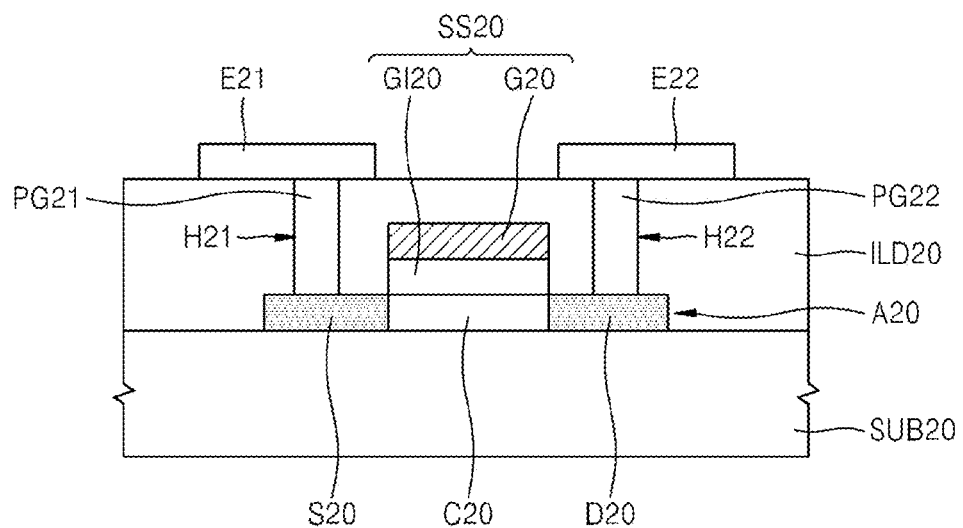

Referring to FIG. 23E, an interlayer insulating layer ILD20 that covers the stacked structure SS20, and the source region S20 and the drain region D20 may be formed on the substrate SUB20. First and second contact holes H21 and H22 through which the source region S20 and the drain region D20 are exposed may be formed by etching the interlayer insulating layer ILD20, and the first conductive plug PG21 and the second conductive plug PG22 may be respectively formed in the first and second contact holes H21 and H22. Next, the first electrode E21 that contacts the first conductive plug PG21 and the second electrode E22 that contacts the second conductive plug PG22 may be formed on the interlayer insulating layer ILD20. Next, although not shown in FIG. 23E, a passivation layer that covers the first and second electrodes E21 and E22 may be further formed on the interlayer insulating layer ILD20. Annealing (e.g., performing heat treatment on) the substrate SUB20 at a desired (and/or alternatively predetermined) temperature in order to improve characteristics of a device may be further performed before or after the passivation layer is formed.

The method of FIGS. 23A through 23E is a method of manufacturing the TFT of FIG. 19. The TFT of FIG. 20 may be manufactured by using a modification of the method of FIGS. 23A through 23E. For example, the source/drain regions S20' and D20' of FIG. 20 may be formed by performing a first plasma treating on the active layer A20 at both sides of the stacked structure SS20 in the operation of FIG. 23D, forming an insulating spacer on both side walls of the stacked structure SS20, and performing a second plasma treating on the active layer A20 at both sides of the stacked structure SS20 and the insulating spacer. Next, the TFT as shown in FIG. 20 may be manufactured by performing a subsequent process. In addition, the method of FIGS. 23A through 23E may be modified in various ways.

Electronic Device

TFTs according to example embodiments may be applied as a switching device or a driving device of a display apparatus such as an organic light-emitting display apparatus or a liquid crystal display apparatus. As described above, since the TFT has a high mobility, a low swing value, a low OFF current, and excellent switching characteristics (ON/OFF characteristics), when the TFT is applied to a display apparatus, the performance of the display apparatus may be improved. Accordingly, the TFT may be effectively used to realize a next generation high-performance/high-resolution/large-size display apparatus. Also, the TFT may be applied for various purposes to other electronic devices such as a memory device or a logic device as well as a display apparatus. For example, the TFT may be used as a transistor constituting a peripheral circuit of a memory device or a selection transistor.

While TFTs according to example embodiments having one gate electrode have been described with reference to FIGS. 3, 4, 16-18, and 19-21, example embodiments are not limited thereto. Some TFTs according to example embodiments may include a plurality of gate electrodes.

Figure 24:
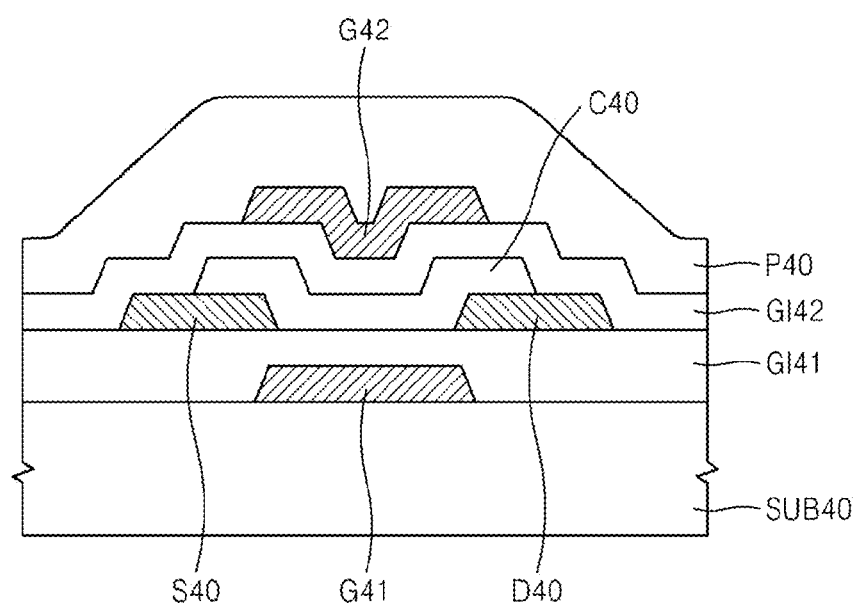
FIG. 24 is a cross-section view illustrating a TFT according to example embodiments.

FIG. 24 is a cross-section view illustrating a TFT according to example embodiments.

Referring to FIG. 24, a TFT according to example embodiments may include a double-gate structure. As shown in FIG. 24, the double-gate TFT may include a substrate SUB40, a lower gate electrode G41 on the substrate SUB40, a lower gate insulating layer GI41 covering the lower gate electrode G41 and the substrate SUB40, source and drain electrodes S40 and D40 spaced apart from each other on the lower gate insulating layer GI41, and a channel layer 40. The channel layer 40 may include end portions that cover parts of the source and drain electrodes S40 and D40 and a middle portion of the channel layer C40 that extends between the source and drain electrodes S40 and D40 over the lower gate electrode G41. An upper gate insulating layer GI42 may be on the lower gate insulating layer GI42 and cover the source and drain electrodes S40 and D40 and the channel layer C40. An upper gate electrode G42 may be on a portion of the upper gate insulating layer GI42 that is above the lower gate electrode G41. A passivation layer P40 may cover the upper gate electrode G42 and the upper gate insulating layer GI42.

The substrate SUB40 may be formed of the same materials as the substrate SUB 10 described previously with regard to FIG. 3. The lower gate electrode G41 and the upper gate electrode G42 may be formed of the same materials as the gate electrode G10 described previously with regard to FIG. 3. Additionally, a material of the lower gate electrode G41 may be the same as or different than a material of the upper gate electrode G42. The lower gate insulating layer GI41 and the upper gate insulating layer GI42 may be formed of the same materials as the gate insulating layer GI10 described previously with regard to FIG. 3. Additionally, a material of the lower gate insulating layer GI41 may be the same as or different than a material of the upper gate insulating layer GI42.

A material of the channel layer C40 may be the same as the semiconductor material 100 of FIG. 1 or may be the same as the semiconductor material 100' of FIG. 2. That is, the channel layer C40 may be formed of a semiconductor material including zinc, fluorine, oxygen, and nitrogen, or a semiconductor material including zinc, fluorine, and nitrogen. In other words, the channel layer C40 may include zinc fluorooxynitride or zinc fluoronitride. A material, properties, characteristics, and modifications of the channel layer C40 may be the same as or similar to those of the semiconductor materials 100 and 100' of FIGS. 1 and 2. A thickness of the channel layer C40 may range from about 10 nm to about 150 nm, for example, from about 20 nm to about 100 nm. However, a thickness range of the channel layer C40 may be changed.

Materials of the source and drain electrodes S40 and D40 may be the same as materials of the source electrode S10 and the drain electrode D10 described previously with regard to FIG. 3. A material of the passivation layer P40 may be the same as materials of the passivation layer P10 described previously with regard to FIG. 3.

Figure 25:
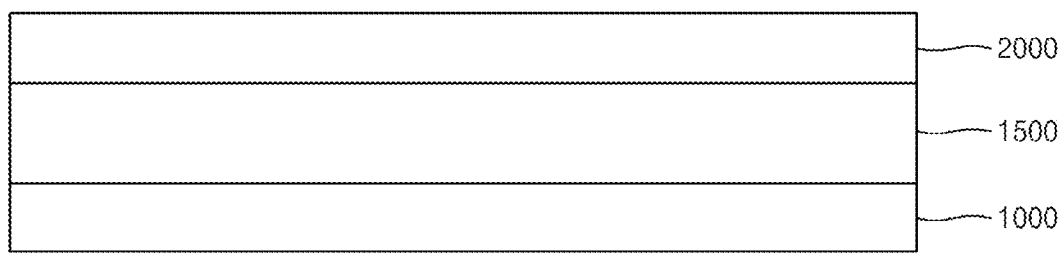
FIG. 25 is a cross-sectional view illustrating an electronic device (display apparatus) including a TFT, according to example embodiments.

FIG. 25 is a cross-sectional view illustrating an electronic device including a TFT, according to example embodiments. The electronic device of FIG. 25 is a display apparatus.

Referring to FIG. 25, an intermediate element layer 1500 may be disposed between a first substrate 1000 and a second substrate 2000. The first substrate 1000 may be an array substrate including a transistor according to example embodiments, for example, at least one of the TFTs of FIGS. 3, 4, 15 through 21, and 24, which acts as a switching device or a driving device. The second substrate 2000 may be a substrate facing the first substrate 1000. A configuration of the intermediate element layer 1500 may vary according to a type of the display apparatus. When the display apparatus is an organic light-emitting display apparatus, the intermediate element layer 1500 may include an "organic light-emitting layer". When the display apparatus is a liquid crystal display apparatus, the intermediate element layer 1500 may include a "liquid crystal layer". Also, when the display apparatus is a liquid crystal display apparatus, a backlight unit (not shown) may be further disposed under the first substrate 1000. A configuration of the electronic device including the TFT is not limited to the structure of FIG. 25, and may be modified in various ways.

Although some TFTs according to example embodiments have been described, it will be understood by one of ordinary skill in the art that elements and structures of the TFTs of FIGS. 3, 4, 15 through 21 and 24 may be modified in various ways. In detail, a channel layer may be formed to have a multi-layer structure, and in this case, at least one of a plurality of layers constituting the channel layer may be formed of the semiconductor material 100 or 100' of FIG. 1 or 2. The methods of FIGS. 22A through 22G and 23A through 23E may be changed in various ways. Also, TFTs according to example embodiments may be applied for various purposes to various electronic devices as well as to the display apparatus of FIG. 25. Accordingly, semiconductor materials, TFTs, and/or electronic devices according to example embodiments have been described in a descriptive sense and not for the purposes of limitation.

While some example embodiments have been particularly shown and described with reference to example embodiments thereof, it will be understood by one of ordinary skill in the art that various changes in form and details may be made therein without departing from the spirit and scope of the claims.

What is claimed is:

1. A compound semiconductor comprising:
   zinc (Zn);
   nitrogen (N); and
   fluorine (F), wherein a composition ratio of fluorine (F) in the compound semiconductor with respect to materials except for zinc (Zn) is 3 at % or more.

2. The compound semiconductor of claim 1, further comprising:
   oxygen (O),
   wherein the compound semiconductor includes zinc oxynitride (ZnON) containing fluorine (F).

3. The compound semiconductor of claim 2, wherein the composition ratio of fluorine (F) with respect to materials except for zinc (Zn) in the compound semiconductor is in a range of 3 at % to 15 at %.

4. The compound semiconductor of claim 1, wherein the compound semiconductor includes zinc fluoronitride (ZnFN).

5. The compound semiconductor of claim 1, wherein the compound semiconductor includes an amorphous phase.

6. The compound semiconductor of claim 1, further comprising:
   at least one of a Group I element, a Group II element, a Group III element, a Group IV element, a Group V element, and a Lanthanide (Ln) element.

7. A thin film transistor (TFT) comprising:
   a gate electrode;
   a channel corresponding to the gate electrode, the channel including the compound semiconductor of claim 1;
   a gate insulating layer between the gate electrode and the channel; and
   a source electrode and a drain electrode respectively contacting two portions of the channel.

8. The thin film transistor of claim 7, wherein
   the compound semiconductor includes oxygen (O), and
   the compound semiconductor include zinc oxynitride (ZnON) containing fluorine.

9. The thin film transistor of claim 7, wherein the compound semiconductor include zinc fluoronitride (ZnFN).

10. The thin film transistor of claim 7, wherein the compound semiconductor includes an amorphous phase.

11. The thin film transistor of claim 7, wherein the compound semiconductor includes a nanocrystalline phase.

12. The thin film transistor of claim 7, further comprising:
    a substrate, wherein
    the gate electrode is on the substrate,
    the gate insulating layer is on the gate electrode,
    the channel is on a region of the gate insulating layer corresponding to the gate electrode.

13. The thin film transistor of claim 7, further comprising:
    a substrate, wherein
    the source and drain electrodes are on the substrate,
    the channel is on the substrate between the source and drain electrodes,
    the gate insulating layer is on the channel, the gate electrode is on a region of the gate insulating layer corresponding to the channel.

14. The compound semiconductor of claim 1, wherein the compound semiconductor is formed of zinc oxynitride containing fluorine.

15. The compound semiconductor of claim 1, wherein the compound semiconductor is formed of zinc fluoronitride.

16. A compound semiconductor comprising:
   zinc (Zn);
   nitrogen (N); and
   fluorine (F), wherein the compound semiconductor includes a nanocrystalline phase.

17. The compound semiconductor of claim 16, wherein a composition ratio of fluorine (F) in the compound semiconductor with respect to materials except for zinc (Zn) is 3 at % or more.

18. A thin film transistor (TFT) comprising:
   a gate electrode;
   a channel corresponding to the gate electrode, the channel including the compound semiconductor of claim 16;
   a gate insulating layer between the gate electrode and the channel; and
   a source electrode and a drain electrode respectively contacting two portions of the channel.

19. The thin film transistor of claim 18, further comprising:
   a substrate, wherein
   the gate electrode is on the substrate,
   the gate insulating layer is on the gate electrode,
   the channel is on a region of the gate insulating layer corresponding to the gate electrode.

20. The thin film transistor of claim 18, a substrate, wherein
   the source and drain electrodes are on the substrate,
   the channel is on the substrate between the source and drain electrodes,
   the gate insulating layer is on the channel,
   the gate electrode is on a region of the gate insulating layer corresponding to the channel.

* * * * *